United States Patent
Cho et al.

(10) Patent No.: US 9,431,476 B2
(45) Date of Patent: Aug. 30, 2016

(54) SEMICONDUCTOR DEVICES INCLUDING CAPACITORS AND METHODS OF MANUFACTURING THE SAME

(71) Applicant: Samsung Electronics Co., Ltd., Suwon-si, Gyeonggi-do OT (KR)

(72) Inventors: Young-Seung Cho, Yongin-si (KR); Sung-Eui Kim, Suwon-si (KR); Ji-Young Kim, Yongin-si (KR); Hoon Jeong, Hwaseong-si (KR); Chan-Won Kim, Seoul (KR); Jong-Bom Seo, Seoul (KR); Seung-Jun Lee, Bucheon-si (KR); Jun-Soo Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/087,349

(22) Filed: Mar. 31, 2016

(65) Prior Publication Data

US 2016/0225845 A1  Aug. 4, 2016

Related U.S. Application Data

(62) Division of application No. 14/296,850, filed on Jun. 5, 2014, now Pat. No. 9,330,960.

(30) Foreign Application Priority Data

Jun. 10, 2013 (KR) .................. 10-2013-0065699

(51) Int. Cl.
| | |
|---|---|
| H01L 21/00 | (2006.01) |
| H01L 49/02 | (2006.01) |
| H01L 27/108 | (2006.01) |
| H01L 21/764 | (2006.01) |

(52) U.S. Cl.
CPC ............ *H01L 28/88* (2013.01); *H01L 21/764* (2013.01); *H01L 27/10808* (2013.01); *H01L 27/10811* (2013.01); *H01L 27/10852* (2013.01); *H01L 28/90* (2013.01)

(58) Field of Classification Search
CPC ..... H01L 28/88; H01L 28/90; H01L 21/764; H01L 27/10808; H01L 27/10811; H01L 27/10852
See application file for complete search history.

(56) References Cited

U.S. PATENT DOCUMENTS

| | | |
|---|---|---|
| 6,165,839 A | 12/2000 | Lee et al. |
| 6,380,579 B1 | 4/2002 | Nam et al. |
| 6,399,399 B2 | 6/2002 | Yamamoto |

(Continued)

FOREIGN PATENT DOCUMENTS

| | | |
|---|---|---|
| KR | 1020040093300 A | 11/2004 |
| KR | 1020080000843 A | 1/2008 |
| KR | 1020090076347 A | 7/2009 |

*Primary Examiner* — Nicholas Tobergte
(74) *Attorney, Agent, or Firm* — Myers Bigel & Sibley, P.A.

(57) ABSTRACT

A semiconductor device includes a first capacitor structure, a second capacitor structure, and an insulation pattern. The first capacitor structure includes a first lower electrode, a first dielectric layer and a first upper electrode sequentially stacked on a substrate. The second capacitor structure includes a second lower electrode, a second dielectric layer and a second upper electrode sequentially stacked on the substrate, and is adjacent to the first capacitor structure. The insulation pattern partially fills a space between the first and second capacitor structures, and an air gap is formed between the first and second capacitor structures on the insulation pattern.

10 Claims, 31 Drawing Sheets

(56) References Cited

U.S. PATENT DOCUMENTS

| | | |
|---|---|---|
| 6,486,025 B1 | 11/2002 | Liu et al. |
| 6,501,120 B1 | 12/2002 | Tu et al. |
| 6,962,845 B2 | 11/2005 | Lee |
| 7,288,454 B2 | 10/2007 | Lee et al. |
| 7,449,739 B2 | 11/2008 | Heitmann et al. |
| 7,452,783 B2 | 11/2008 | Cho et al. |
| 7,897,474 B2 | 3/2011 | Eto |
| 7,910,428 B2 | 3/2011 | Lee et al. |
| 8,084,323 B2 | 12/2011 | Nieh |
| 2004/0089891 A1 | 5/2004 | Anma et al. |
| 2005/0191820 A1 | 9/2005 | Tu et al. |
| 2012/0193757 A1 | 8/2012 | Shih et al. |

SEMICONDUCTOR DEVICES INCLUDING CAPACITORS AND METHODS OF MANUFACTURING THE SAME

CROSS-REFERENCE TO RELATED APPLICATION

The present application is a divisional application of and claims priority from U.S. patent application Ser. No. 14/296,850, filed on Jun. 5, 2014, and claims priority under 35 USC §119 to Korean Patent Application No. 10-2013-0065699, filed on Jun. 10, 2013 in the Korean Intellectual Property Office (KIPO), the contents of which are herein incorporated by reference in their entirety.

BACKGROUND

1. Field

Example embodiments relate to semiconductor devices including capacitors and methods of manufacturing the same.

2. Description of the Related Art

A semiconductor device, such as a DRAM device may include capacitors. As semiconductor device, have been highly integrated, each capacitor may be formed in a narrow area. Additionally, each capacitor may need to have a high capacitance.

SUMMARY

Example embodiments provide a semiconductor device including capacitors having a high capacitance.

Example embodiments provide a method of manufacturing a semiconductor device including capacitors having a high capacitance.

According to example embodiments, there is provided a semiconductor device. The semiconductor device includes a first capacitor structure, a second capacitor structure, and an insulation pattern. The first capacitor structure includes a first lower electrode, a first dielectric layer and a first upper electrode sequentially stacked on a substrate. The second capacitor structure includes a second lower electrode, a second dielectric layer and a second upper electrode sequentially stacked on the substrate, and is adjacent to the first capacitor structure. The insulation pattern partially fills a space between the first and second capacitor structures, and an air gap is formed between the first and second capacitor structures on the insulation pattern.

In example embodiments, the semiconductor device may further include a plate electrode overlying the insulation pattern and contacting the first and second upper electrodes, and a boundary of the air gap may be defined by the plate electrode.

In example embodiments, the plate electrode may include at least one plate electrode layer.

In example embodiments, the first and second upper electrodes may be spaced apart from each other.

In example embodiments, the first and second capacitor structures may have substantially the same shape, and each of a first stacked structure including the first lower electrode and the first dielectric layer and a second stacked structure including the second lower electrode and the second dielectric layer may have a cylindrical shape, and the first and second upper electrodes may fill inner spaces of the cylindrical first and second stacked structures, respectively.

In example embodiments, upper portions of the first upper electrode and the first dielectric layer may protrude from a top surface of the first lower electrode, and upper portions of the second upper electrode and the second dielectric layer may protrude from a top surface of the second lower electrode.

In example embodiments, an upper width of each of the first and second capacitor structures may be greater than a distance between the first and second capacitor structures.

In example embodiments, the upper width of each of the first and second capacitor structures may be about two times to about 10 times of the distance between the first and second capacitor structures.

In example embodiments, each of the first and second lower electrodes may have a cylindrical shape of which an inner diameter becomes narrower from a top portion toward a bottom portion thereof.

In example embodiments, the insulation pattern may include an insulating material having a dielectric constant lower than that of silicon nitride.

In example embodiments, the insulation pattern may fill a lower portion of the space between the first and second capacitor structures, and the insulation pattern may have a thickness of about 50% to about 90% of a height of the first and second capacitor structures.

In example embodiments, the semiconductor device may further include an insulation pattern having a top surface substantially coplanar with a top surface of the first and second capacitor structures.

According to example embodiments, there is provided a semiconductor device. The semiconductor device includes a first capacitor structure, a second capacitor structure, an insulation pattern and a plate electrode. The first capacitor structure includes a first lower electrode, a first dielectric layer and a first upper electrode. The first lower electrode has a cylindrical shape, the first dielectric layer contacts an inner wall of the cylindrical first lower electrode, and the first upper electrode is on the first dielectric layer and fills an inner space of the cylindrical first lower electrode. The second capacitor structure includes a second lower electrode, a second dielectric layer and a second upper electrode. The second lower electrode has a cylindrical shape, the second dielectric layer contacts an inner wall of the cylindrical second lower electrode, and the second upper electrode is on the second dielectric layer and fills an inner space of the cylindrical second lower electrode. The insulation pattern partially fills a space between the first and second capacitor structures. The plate electrode overlies the insulation pattern and contacts the first and second upper electrodes. An air gap is formed under the plate electrode between the first and second capacitor structures on the insulation pattern.

In example embodiments, an upper width of each of the first and second capacitor structures may be greater than a distance between the first and second capacitor structures.

In example embodiments, the insulation pattern may fill a lower portion of the space between the first and second capacitor structures, and a top surface of the insulation pattern may be about 50% to about 90% of a height of the first and second capacitor structures.

According to example embodiments, there is provided a method of manufacturing a semiconductor device. In the method, a mold layer having first and second holes is formed on a substrate. A first capacitor structure including a first lower electrode, a first dielectric layer and a first upper electrode is formed in the first holes. A second capacitor structure including a second lower electrode, a second dielectric layer and a second upper electrode is formed in the second holes. The mold layer between the first and second capacitor structures is partially etched to form an insulation pattern. A plate electrode is formed on the first and second upper electrodes to overlie the insulation pattern. An air gap is formed by the plate electrode between the first and second capacitor structures.

In example embodiments, when the first and second capacitor structures are formed, a lower electrode layer may be formed on inner walls of the first and second holes and the mold layer, the lower electrode layer may be partially etched to form the first and second lower electrodes having a cylindrical shape, a dielectric layer may be formed on the first and second lower electrodes and the mold layer, an upper electrode may be formed on the dielectric layer to fill remaining portions of the first and second holes, and upper portions of the upper electrode layer and the dielectric layer may be planarized to form the first upper electrode and the first dielectric layer in the first holes and to form the second upper electrode and the second dielectric layer in the second holes.

In example embodiments, when the mold layer is partially etched, a dry etch process or a wet etch process may be performed.

In example embodiments, prior to partially etching the mold layer, a mask covering a portion of the mold layer in which any of the first and second capacitor structures is formed may be formed.

In example embodiments, the insulation pattern may be formed to have a thickness of about 60% to about 80% of a height of the first and second capacitor structures.

In example embodiments, an inner diameter of each of the first and second holes may be greater than a distance between the first and second holes.

In example embodiments, when the mold layer is formed, a mold layer may be formed using an insulating material having a dielectric constant lower than silicon nitride, the mold layer may be partially etched to form the first and second holes.

In example embodiments, the mold layer may include a first silicon oxide layer, an etch stop layer and a second silicon oxide layer, and the first silicon oxide layer may be formed to have a top surface substantially coplanar with a top surface of the insulation pattern.

In example embodiments, when the plate electrode is formed, a first plate electrode layer may be formed on the first and second upper electrodes under a deposition condition in which the first plate electrode only partially fills a space between the first and second upper electrodes, and a second plate electrode layer may be formed on the first plate electrode layer under a second deposition condition having a step coverage better than the first deposition condition.

In example embodiments, the first and second plate electrode layer may be formed using substantially the same material.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor device including capacitor structures in accordance with example embodiments, and FIG. 2 is a plan view of the capacitor structures of the semiconductor device of FIG. 1;

FIGS. 3 to 9 are cross-sectional views illustrating stages of a method of manufacturing the semiconductor device of FIG. 1 in accordance with example embodiments;

FIGS. 10 to 12 are cross-sectional views illustrating a method of manufacturing the semiconductor device of FIG. 1 in accordance with other example embodiments;

FIG. 13 is a cross-sectional view illustrating a DRAM device in accordance with example embodiments, and FIG. 14 is a plan view of the DRAM device of FIG. 13;

FIGS. 15 to 21 are cross-sectional views illustrating a method of manufacturing the DRAM device of FIGS. 13 and 14;

FIG. 22 is a DRAM device in accordance with example embodiments;

FIGS. 23 and 24 are cross-sectional views illustrating stages of a method of manufacturing the DRAM device of FIG. 22;

FIG. 25 is a cross-sectional view illustrating a semiconductor device in accordance with example embodiments;

FIGS. 26 to 29 are cross-sectional views illustrating stages of a method of manufacturing the semiconductor device of FIG. 25;

FIG. 30 is a cross-sectional view of a semiconductor device in accordance with example embodiments;

FIGS. 31 and 32 are cross-sectional views illustrating stages of a method of manufacturing the semiconductor device of FIG. 30;

FIG. 33 is a cross-sectional view of a semiconductor device in accordance with example embodiments;

FIGS. 34 and 35 are cross-sectional views illustrating stages of a method of manufacturing the semiconductor device of FIG. 33;

FIG. 36 is a cross-sectional view of a semiconductor device in accordance with example embodiments; and FIG. 37 is a block diagram illustrating a schematic construction of a system in accordance with example embodiments.

DESCRIPTION OF EMBODIMENTS

Figure 1:
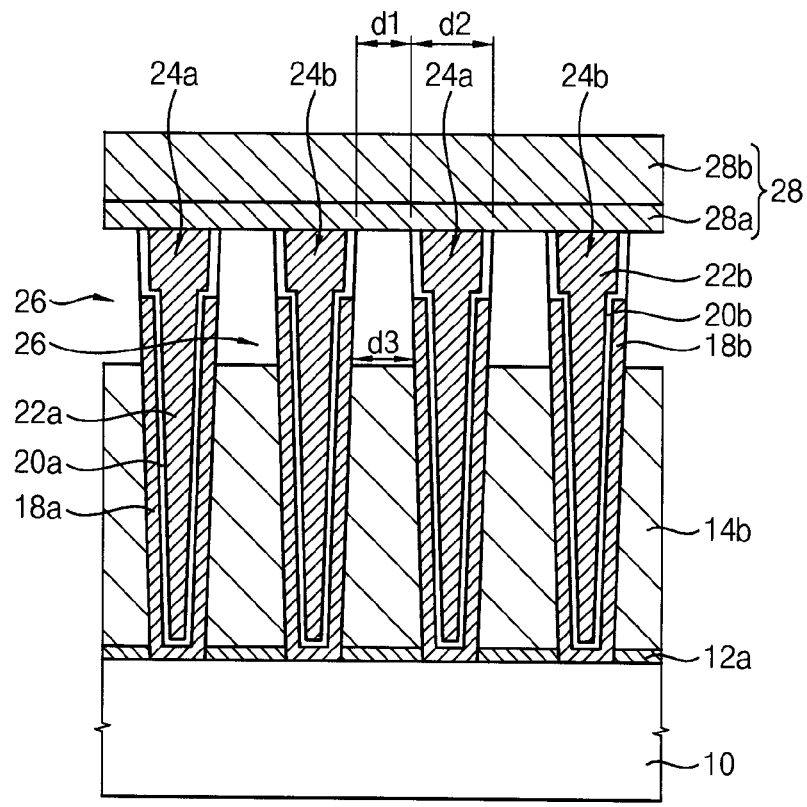
FIGS. 1 to 37 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout the description. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
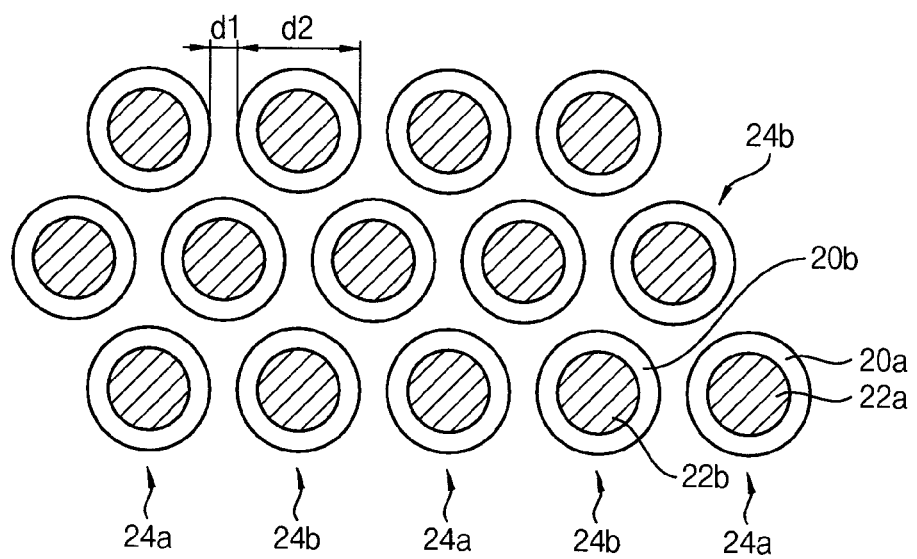

FIG. 1 is a cross-sectional view illustrating a semiconductor device including capacitor structures in accordance with example embodiments. FIG. 2 is a plan view of the capacitor structures of the semiconductor device of FIG. 1.

Referring to FIG. 1, the semiconductor device may include first and second capacitor structures 24a and 24b, an insulation pattern 14b, and a plate electrode 28. The first and second capacitor structures 24a and 24b may be adjacent to each other on a substrate 10, the insulation pattern 14b may partially fill a space between the first and second capacitor structures 24a and 24b, and the plate electrode 28 may define a boundary of an air gap 26 over the insulation pattern 14b and electrically connect upper electrodes 22 of the first and second capacitor structures 24a and 24b to each other.

Contact regions and an insulation region may be defined on the substrate 10. For example, contact plugs may be formed in the contact regions, and an insulating interlayer may be formed in the insulation region. The contact regions may serve as a region in which capacitor structures may be formed. The contact regions may be regularly disposed and spaced apart from each other.

A plurality of capacitor structures having substantially the same shape and construction may be formed in the contact regions, respectively. Hereinafter, neighboring two capacitor structures may be referred to as first and second capacitor structures 24a and 24b.

The first capacitor structure 24a may include a first lower electrode 18a, a first dielectric layer pattern 20a and a first upper electrode 22a. The second capacitor structure 24b may include a second lower electrode 18b, a second dielectric layer pattern 20b and a second upper electrode 22b.

The first lower electrode 18a may have a cylindrical shape. The first lower electrode 18a may have a sidewall that is slanted with respect to a top surface of the substrate 10, and thus an inner width of the cylindrical first lower electrode 18a may become narrower from a top portion to a bottom portion thereof. The first lower electrode 18a may contact the contact region of the substrate 10. The first lower electrode 18a may include a metal or a metal nitride, e.g., titanium, titanium nitride, tantalum, tantalum nitride, etc. These may be used alone or in a combination thereof. Alternatively, the first lower electrode 18a may include doped polysilicon.

The first dielectric layer pattern 20a may be formed on an inner wall of the cylindrical first lower electrode 18a, and further extend upward on a top surface of the cylindrical first lower electrode 18a. Thus, an upper portion of the first dielectric layer pattern 20a may be exposed. A first structure including the first lower electrode 18a and the first dielectric layer pattern 20a sequentially stacked may have a cylindrical shape. The first dielectric layer pattern 20a may include a metal oxide having a high dielectric constant. For example, the first dielectric layer pattern 20a may include aluminum oxide, hafnium oxide, tantalum oxide, etc. These may be used alone or in a combination thereof.

The first upper electrode 22a may be formed on the first dielectric layer pattern 20a. The first upper electrode 22a may fill an inside of the cylindrical first structure. The first upper electrode 22a may have a pillar shape. The first upper electrode 22a may protrude from a top surface of the first lower electrode 18a. Thus, an upper portion of the first upper electrode 22a together with the upper portion of the first dielectric layer pattern 20a may be exposed.

The first and second capacitor structures 24a and 24b may have substantially the same shape and construction. That is, the second lower electrode 18b may have substantially the same shape and construction as that of the first lower electrode 18a. The second dielectric layer pattern 20b may have substantially the same shape and construction as that of the first dielectric layer pattern 20a. The second upper electrode 22b may have substantially the same shape and construction as that of the first upper electrode 22a.

Each of the first and second lower electrodes 18a and 18b of the first and second capacitor structures, respectively, may have a concave structure. The lower electrodes 18a and 18b may not be electrically connected to each other, but may be electrically isolated from each other. Each of the first and second upper electrodes 22a and 22b may be formed on the concave first and second lower electrodes 18a and 18b, respectively. Thus, the upper electrodes 22a and 22b may not be connected to each other, but may have isolated pillar shapes from each other. However, the upper electrodes 22a and 22b may be electrically connected to each other via the plate electrode 28.

The insulation pattern 14b may partially fill the space between the first and second capacitor structures 24a and 24b. That is, the insulation pattern 14b may extend from a portion of the space near bottom portions of the first and second capacitor structures 24a and 24b to a given height. The insulation pattern 14b may contact lower portions of the first and second capacitor structures 24a and 24b to support the first and second capacitor structures 24a and 24b. Due to the insulation pattern 14b, the first and second capacitor structures 24a and 24b may not lean or fall down.

The insulation pattern 14b may include an insulating material having a dielectric constant lower than that of silicon nitride. For example, the insulation pattern 14b may include silicon oxide.

If a height of the insulation pattern 14b is lower than half of a height of the first and second capacitor structures 24a and 24b, the first and second capacitor structures 24a and 24b may not be prevented from leaning or falling down. If the height of the insulation pattern 14b is higher than 90% of the height of the first and second capacitor structures 24a and 24b, the air gap 26 between the first and second capacitor structures 24a and 24b may decrease too much so that a leakage current or a parasitic capacitance between the first and second capacitor structures 24a and 24b may not be sufficiently reduced. Thus, the height of the insulation pattern 14b may be in a range of about 50% to about 90%, preferably, about 60% to about 80%, of the height of the first and second capacitor structures 24a and 24b.

An etch stop layer pattern 12a may be formed between the insulation pattern 14b and the substrate 10 in the insulation region. The etch stop layer pattern 12a may include an insulating material having different etching characteristics from the insulation pattern 14b. That is, the etch stop layer pattern 12a may include a material that may be selectively etched from the insulation pattern 14b. When the insulation pattern 14b includes silicon oxide, the etch stop layer pattern 12a may include silicon nitride. Alternatively, the etch stop layer pattern 12a may not be formed.

The plate electrode 28 may directly contact top surfaces of the first and second upper electrodes 22a and 22b. The plate electrode 28 may overlie the insulation pattern 14b and the first and second upper electrodes 22a and 22b, and may be spaced apart from a top surface of the insulation pattern 14b and. Thus, the air gap 26 may be formed between the plate electrode 28 and the top surface of the insulation pattern 14b. The plate electrode 28 may be electrically insulated from the first and second lower electrodes 18a and 18b.

Thus, the air gap 26 may be formed between portions of the first and second capacitor structures 24a and 24b that are disposed above the insulation pattern 14b. As the height of the insulation pattern 14b decreases, a thickness of the air gap 26 may increase. The thickness of the air gap 26 may be in a range of about 10% to about 50%, preferably, about 20% to about 40%, of the height of the first and second capacitor structures 24a and 24b.

The plate electrode 28 may have a single layer or a multi-layered structure. The plate electrode 28 may include, e.g., polysilicon, silicon-germanium, etc. Alternatively, the plate electrode 28 may include a metal or a metal nitride. In an example embodiment, the plate electrode 28 may have a single layer including polysilicon or silicon-germanium. In another example embodiment, the plate electrode 28 may have a stacked structure of a polysilicon layer and a metal layer including, e.g., tungsten.

When the upper electrodes 22a and 22b include titanium nitride, the plate electrode 28 may include polysilicon, silicon-germanium and/or tungsten. For example, the upper electrodes 22a and 22b and the plate electrode 28 may form a stacked structure of TiN/polysilicon, TiN/silicon-germanium, TiN/silicon-germanium/tungsten, etc. Additionally, a silicon oxide layer or a silicon nitride layer may be further formed on the plate electrode 28.

In an example embodiment, the plate electrode 28 may have a stacked structure including a first plate electrode layer 28a and a second plate electrode layer 28b. The first plate electrode layer 28a may be formed under a first deposition condition in which the air gap 26 may be formed between the first and second capacitor structures 24a and 24b. The second plate electrode layer 28b may be formed under a second deposition condition in which layers may be formed to have a step coverage better than that of the first deposition condition. The first and second plate electrode layers 28a and 28b may be substantially the same material layer. Alternatively, the first and second plate electrode layers 28a and 28b may be different material layers.

In some example embodiments, the plate electrode layer 28 may not be formed. In this case, an insulating interlayer (not shown) may be formed instead of the plate electrode layer.

The cylindrical first and second lower electrode layers 18a and 18b of the first and second capacitor structures 24a and 24b may have an inner width that becomes narrower from a top portion toward a bottom portion thereof. Thus, an upper distance between upper portions of the first and second capacitor structures 24a and 24b may be narrower than a lower distance between lower portions of the first and second capacitor structures 24a and 24b, and a parasitic capacitance and a leakage current may occur more at the upper portions of the first and second capacitor structures 24a and 24b than at the lower portions of the first and second capacitor structures 24a and 24b. However, in accordance with example embodiments, the air gap 26 having a low dielectric constant may be formed between the upper portions of the first and second capacitor structures 24a and 24b, and thus the parasitic capacitance and the leakage current may be reduced at the upper portions of the first and second capacitor structures 24a and 24b.

In a conventional DRAM device in which a space between the first and second capacitor structures 24a and 24b is completely filled with an insulating material, such as silicon oxide or silicon nitride, the first and second capacitor structures 24a and 24b have to be sufficiently spaced apart from each other so as to satisfy the permissible level of leakage current. However, in accordance with example embodiments, even though a first distance d1 between the upper portions of the first and second capacitor structures 24a and 24b is reduced, the permissible level of leakage current may be satisfied. Thus, the first distance d1 between the first and second capacitor structures 24a and 24b may be less than that of a conventional DRAM device. For example, when the permissible level of leakage current between the first and second capacitor structures 24a and 24b of FIGS.

1 and 2 and that of the conventional DRAM device are the same, the first distance d1 of the semiconductor device of FIGS. 1 and 2 may be less than about half of the distance of a conventional DRAM device.

The air gap 26 is formed near the upper portions of the first and second capacitor structures 24a and 24b so that the first distance d1 may be set up to satisfy the permissible level of leakage current with the air gap 26 being formed.

However, a distance between other portions of the first and second capacitor structures 24a and 24b where the insulation pattern 14b is formed may be greater than the first distance d1. That is, a second distance d3 between portions of the first and second capacitor structures 24a and 24b near a top surface of the insulation pattern 14b may be set up to satisfy the permissible level of leakage current with the insulation pattern 14 being formed. Thus, the first distance d1 may be less than the second distance d3.

When a plurality of capacitor structures is formed in a limited area, as the first distance d1 decreases, a diameter d2 of the upper portion of the cylindrical first and second capacitor structures 24a and 24b may be increased.

According to example embodiments, the air gap 26 is formed between the first and second capacitor structures 24a and 24b, and thus the diameter d2 may increase. For example, the diameter d2 may be in a range of about twice to about 10 times of the first distance d1.

When a plurality of capacitor structures is formed in a limited area, as the first distance d1 decreases, bottom portions of the first and second lower electrodes 18a and 18b of the first and second capacitor structures 24a and 24b, respectively, may have an increased area. Thus, the lower electrodes 18a and 18b may have an increased contact area with other structures, e.g., contact plugs (not shown) in the contact regions so that a contact resistance therebetween may be decreased. Additionally, as the bottom portions of the first and second lower electrodes 18a and 18b have an increased area, the first and second dielectric layer patterns 20a and 20b and the first and second upper electrodes 22a and 22b may be easily formed.

The semiconductor device may have the air gap 26 between the first and second capacitor structures 24a and 24b. Thus, the leakage current of the first and second capacitor structures 24a and 24b and the parasitic capacitance between the first and second capacitor structures 24a and 24b may be reduced.

FIGS. 3 to 9 are cross-sectional views illustrating stages of a method of manufacturing the semiconductor device of FIG. 1 in accordance with example embodiments.

Figure 3:
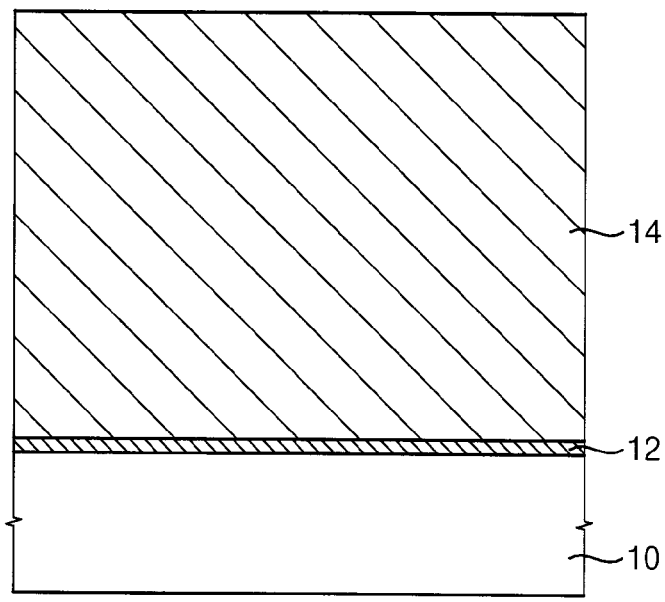

Referring to FIG. 3, an etch stop layer 12 may be formed on a substrate 10 on which contact regions and an insulation region may be defined. Additionally, a mold layer 14 may be formed on the etch stop layer 12.

The etch stop layer 12 may be formed to include an insulating material having different etch characteristics from the mold layer 14. That is, the etch stop layer 12 may be formed to include a material having a high etch selectivity with respect to the mold layer 14. When the mold layer 14 includes silicon oxide, the etch stop layer 12 may be formed to include silicon nitride. Alternatively, the etch stop layer 12 may not be formed for the simplicity of process.

The mold layer 14 may be formed to have a thickness that is substantially the same as or greater than a height of capacitor structures subsequently formed. The mold layer 14 may be formed to include an insulating material having a dielectric constant lower than silicon nitride. The mold layer 14 may be formed to include silicon oxide, such as BPSG, TEOS, HDP-CVD oxide, etc.

In an example embodiment, the mold layer 14 may be formed to have a single layer. Alternatively, the mold layer 14 may be formed to have a multi-layered structure including oxide layers that may have different etch rates from each other. For example, a first mold layer and a second mold layer may be sequentially formed, and the first mold layer may be converted into an insulation pattern 14b (refer to FIG. 7) and the second mold layer may be removed to form an air gap 26 (refer to FIG. 8). The second mold layer may be formed using an oxide that may be etched more than the first mold layer under the same condition.

Figure 4:
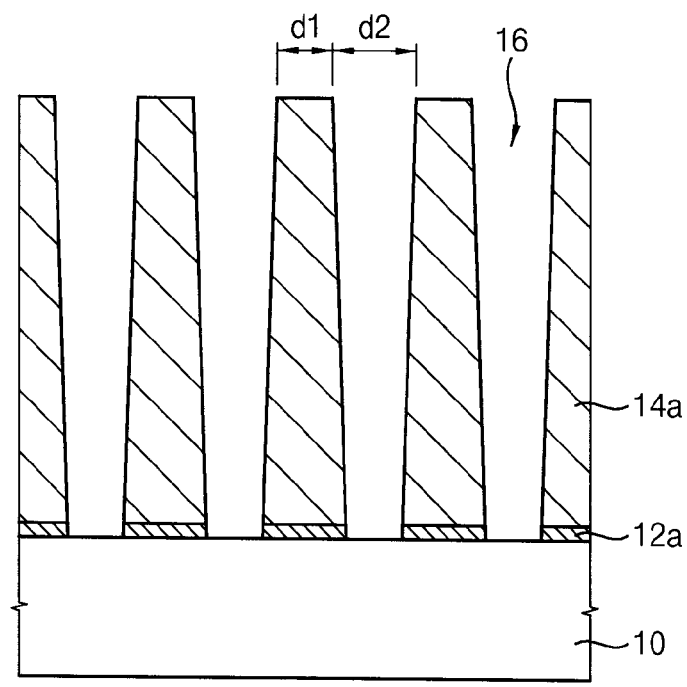

Referring to FIG. 4, an etching mask (not shown) may be formed on the mold layer 14. The etching mask may include a photoresist pattern. Alternatively, the etching mask may include a hard mask.

The mold layer 14 may be etched using the etching mask, and further the etch stop layer 12 may be etched. By the etching process, a mold layer pattern 14a having a plurality of holes 16 may be formed. Top surfaces of the substrate 10 in the contact regions may be exposed by the holes 16. The holes 16 may have a diameter that becomes narrower from a top portion toward a bottom portion thereof. The holes 16 may have a sidewall that may be slanted with respect to the top surface of the substrate 10.

By subsequent processes, first and second capacitor structures 24a and 24b (refer to FIG. 6) may be formed in the holes 16. Thus, the holes 16 may have a shape substantially the same as that of the first and second capacitor structures 24a and 24b. Accordingly, a diameter d2 at an entrance of the holes 16 may be substantially the same as a diameter of an upper portion of the first and second capacitor structures 24a and 24b. Additionally, a first distance d1 between the holes 16 may be substantially the same as a distance between the first and second capacitor structures 24a and 24b.

The diameter d2 at the entrance of the holes 16 may be, e.g., in a range of about two times to about 10 times of the distance between the holes 16.

As the diameter d2 at the entrance of the holes 16 increases, the first and second capacitor structures 24a and 24b may be formed in the holes 16. Additionally, a diameter of a lower portion of the holes 16 may also increase so that a contact area between the first and second capacitor structures 24a and 24b and the top surface of the substrate 10 in the contact region may increase.

Figure 5:
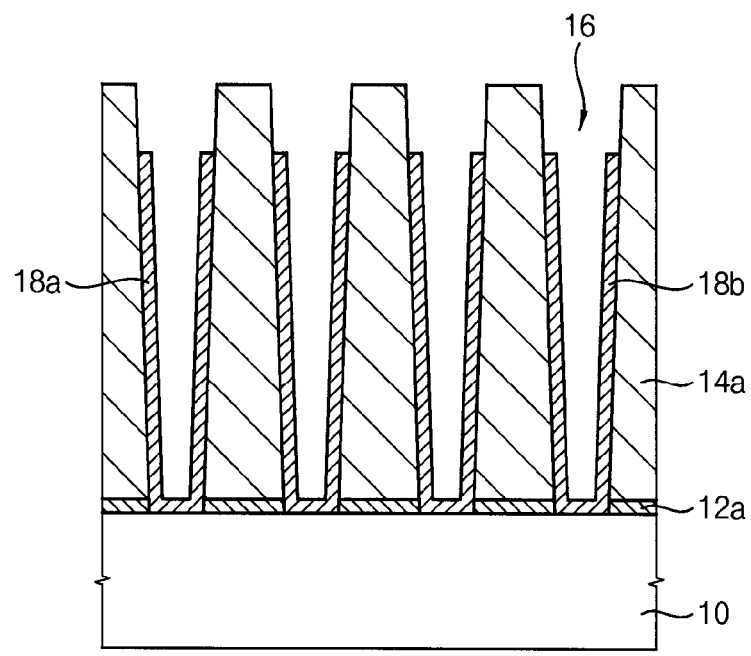

Referring to FIG. 5, a lower electrode layer may be formed on sidewalls of the holes 16, the exposed top surfaces of the substrate 10, and the mold layer pattern 14a.

The lower electrode layer may be formed to include polysilicon, a metal and/or a metal nitride. For example, the lower electrode layer may include titanium, titanium nitride, tantalum, tantalum nitride, etc. These may be used alone or in a combination thereof. The lower electrode layer may be formed by a chemical vapor deposition (CVD) process, a cyclic CVD process, or an atomic layer deposition (ALD) process.

A portion of the lower electrode layer on upper sidewalls of the holes 16 and the mold layer pattern 14a may be removed. The removal process may include an etch back process. By the etch back process, cylindrical lower electrodes 18a and 18b may be formed on sidewalls of the holes 16 and the exposed top surfaces of the substrate 10. That is, upper portions of the lower electrodes 18a and 18b may be located lower than the entrance of the holes 16.

Figure 6:
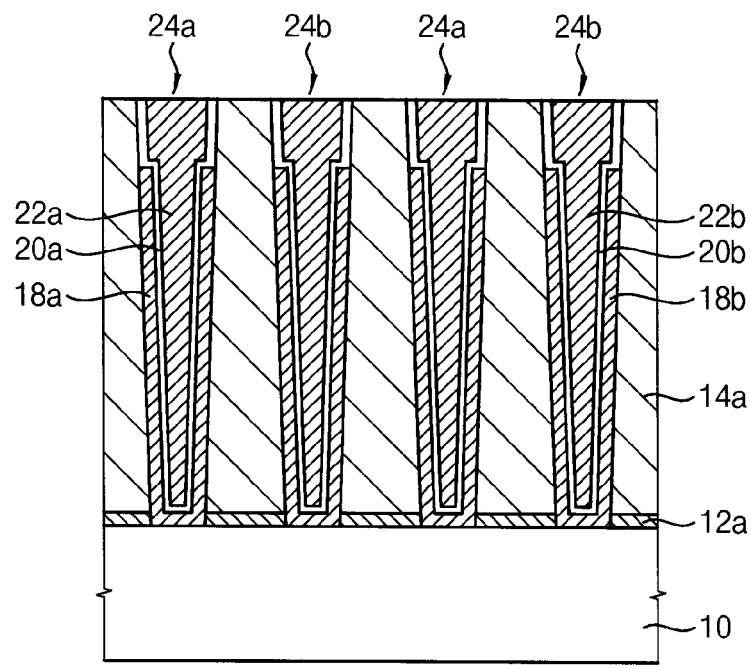

Referring to FIG. 6, a dielectric layer may be formed on the lower electrodes 18a and 18b and the mold layer pattern 14a. The dielectric layer may not completely fill inside spaces of the cylindrical lower electrodes 18a and 18b.

The dielectric layer may include a metal oxide having a dielectric constant greater than silicon oxide. The dielectric layer may be formed using a metal oxide having a good thermal stability and a high energy band gap. For example, the dielectric layer may be formed using hafnium oxide, aluminum oxide, tantalum oxide, etc. These may be used alone or in a combination thereof.

An upper electrode layer may be formed on the dielectric layer. The upper electrode layer may fill an inside space of the dielectric layer. The upper electrode layer may be formed to include, e.g., polysilicon, a metal and/or a metal nitride. For example, the upper electrode layer may be formed to include titanium, titanium nitride, tantalum, tantalum nitride, etc. These may be used alone or in a combination thereof. The upper electrode layer may be formed by a CVD process, a cyclic CVD process, or an ALD process.

Portions of the upper electrode layer and the dielectric layer on the mold layer pattern 14a may be planarized. The planarization process may be performed by a chemical mechanical polishing (CMP) process and/or an etch back process.

Thus, cylindrical dielectric layer pattern 20a and 20b and a pillar shaped upper electrodes 22a and 22b may be formed in the holes 16. A top surface of the upper electrodes 22a and 22b may be higher than a top surface of the lower electrodes 18a and 18b. The lower electrodes 18a and 18b may not be exposed.

By the above processes, the capacitor structures 24a and 24b including the lower electrodes 18a and 18b, the dielectric layer patterns 20a and 20b, and the upper electrodes 22a and 22b, respectively, may be formed in the contact regions. Hereinafter, neighboring two capacitor structures may be referred to as first and second capacitor structures 24a and 24b. The first capacitor structure 24a may include a first lower electrode 18a, a first dielectric layer pattern 20a and a first upper electrode 22a, and the second capacitor structure 24b may include a second lower electrode 18b, a second dielectric layer 20b and a second upper electrode 22b.

Figure 7:
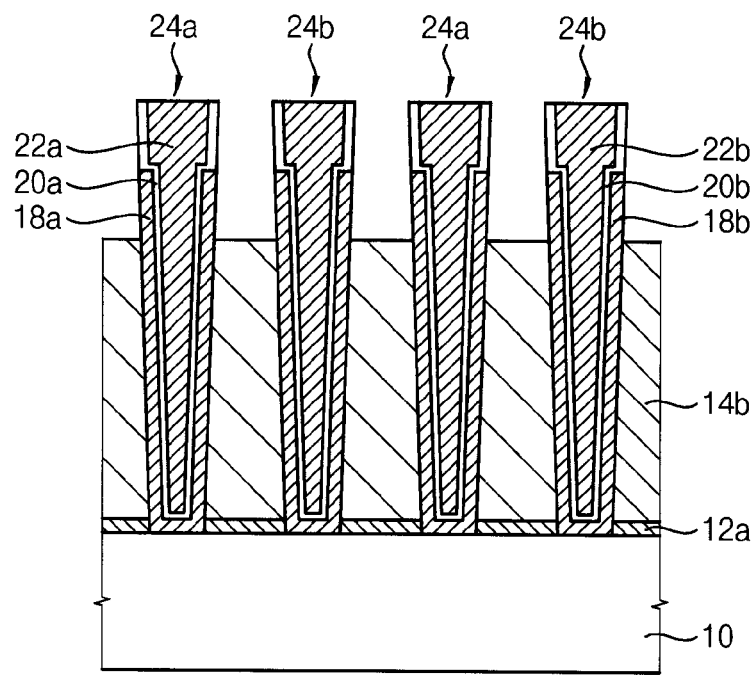

Referring to FIG. 7, an upper portion of the mold layer pattern 14a may be etched to form an insulation pattern 14b. The etching process may include a wet etch process or a dry etch process. The insulation pattern 14b may be formed to have a height that may be about 50% to about 90%, preferably, about 60% to about 80%, of the height of the first and second capacitor structures 24a and 24b.

The insulation pattern 14b may support the first and second capacitor structures 24a and 24b. Thus, even though the height of the first and second capacitor structures 24a and 24b may increase, the first and second capacitor structures 24a and 24b may not lean or fall down.

Figure 8:
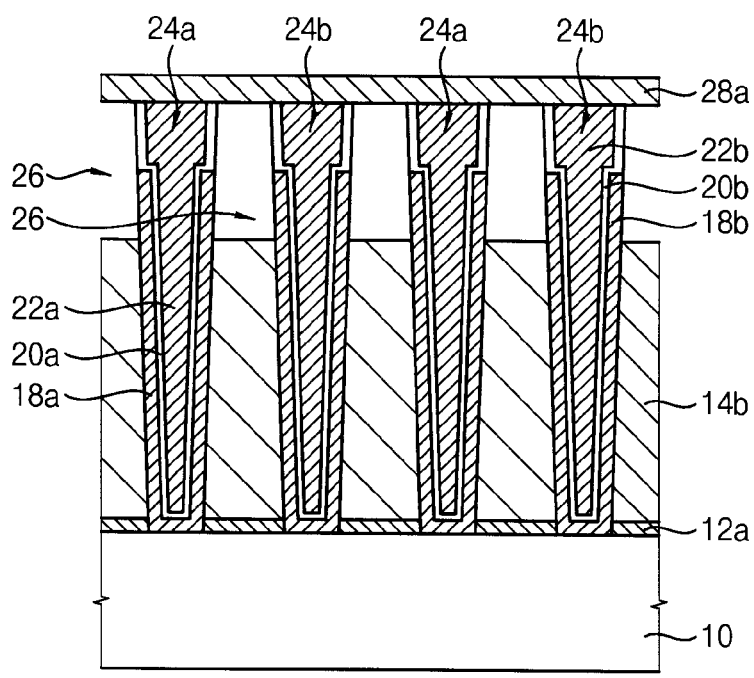

Referring to FIG. 8, a first plate electrode layer 28a may be formed directly on the top surfaces of the first and second upper electrodes 22a and 22b and overlie the insulation pattern 14b. The first plate electrode layer 28a may be spaced apart from the insulation pattern 14b. Thus, an air gap 26 may be formed between the first plate electrode layer 28a and the insulation pattern 14b. The first plate electrode layer 28a may include polysilicon, silicon-germanium, etc.

The first plate electrode layer 28a may not completely fill spaces between the insulation patterns 14b. The first plate electrode layer 28a may be formed under a first deposition condition having a poor step coverage.

Figure 9:
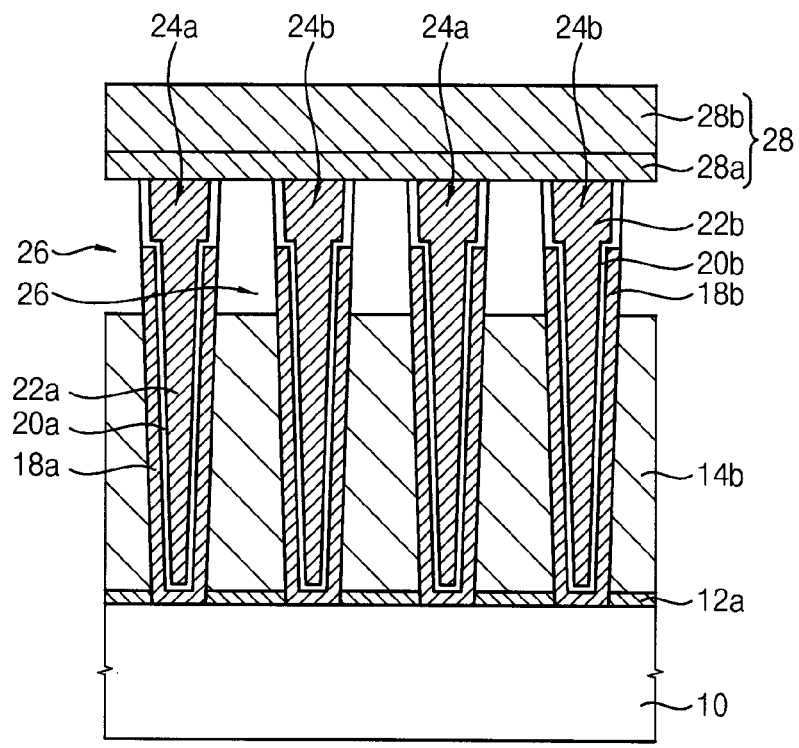

Referring to FIG. 9, a second plate electrode layer 28b may be formed on the first plate electrode layer 28a. The second plate electrode layer 28b may be formed using a material substantially the same as or different from that of the first plate electrode layer 28a.

The second plate electrode layer 28b may be formed under a second deposition condition having a step coverage better than the first step coverage.

The second plate electrode layer 28b may be formed using a semiconductor material, e.g., polysilicon, silicon-germanium, etc., or a metal such as tungsten. These may be used alone or in a combination thereof.

Alternatively, only the first plate electrode layer 28a may be formed without forming the second plate electrode layer 28b. Alternatively, none of the first and second plate electrode layers 28a and 28b may be formed.

According to the above method, the capacitor structures 24a and 24b may be formed, and a leakage current may be reduced.

Figure 10:
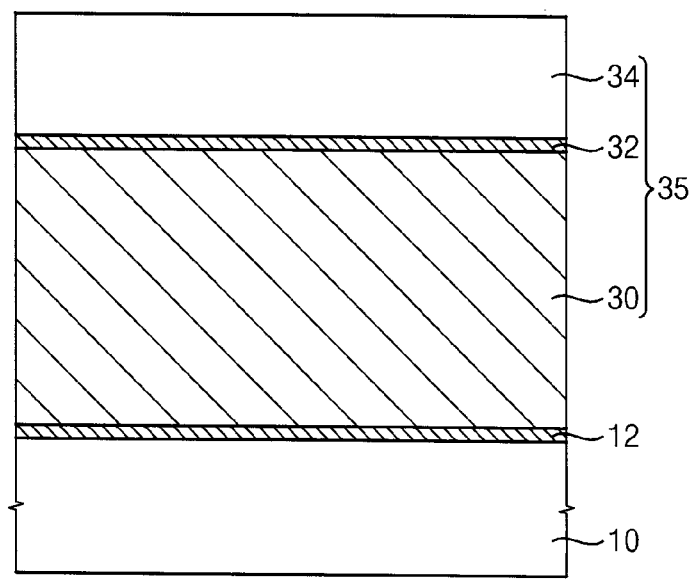
Figure 11:
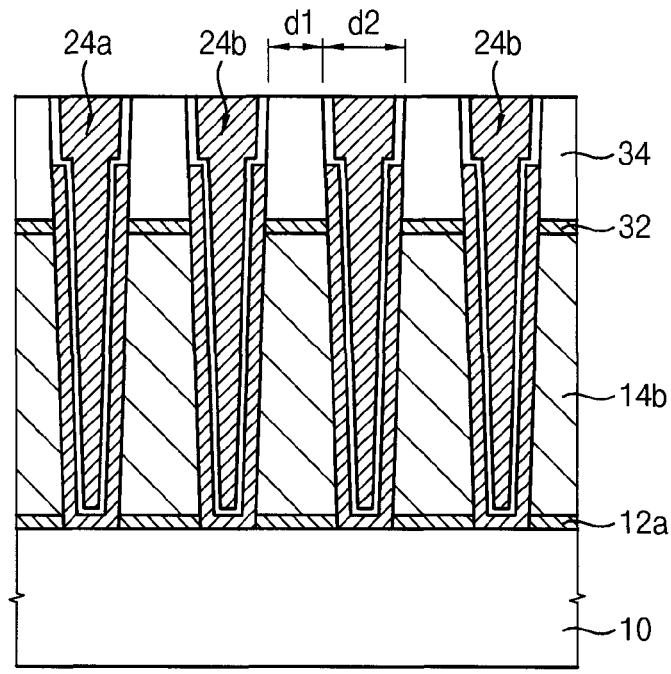
Figure 12:
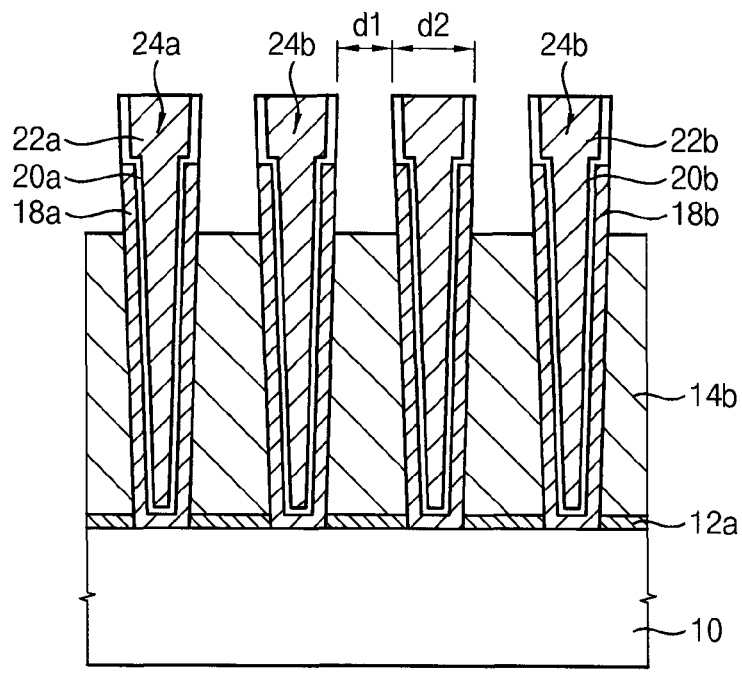

FIGS. 10 to 12 are cross-sectional views illustrating a method of manufacturing the semiconductor device of FIG. 1 in accordance with other example embodiments. This method may be substantially the same as or similar to that of FIGS. 3 to 9, except for forming a stacked structure of a mold layer.

Referring to FIG. 10, a first etch stop layer 12 may be formed on the substrate 10. Additionally, a mold layer structure 35 may be formed on the first etch stop layer 12.

The mold layer structure 35 may have a multi-layered structure including a first mold layer 14, a second etch stop layer 32 and a second mold layer 34 sequentially stacked. The first and second mold layers 30 and 34 may be formed to include silicon oxide. The second etch stop layer 32 may be formed to include a material having etching characteristics different from those of the first and second mold layers 30 and 34. That is, the second etch stop layer 32 may be formed using a material that may be rarely etched when etching the first and second mold layers 30 and 34. The second etch stop layer 32 may be formed using, e.g., silicon nitride. The first and second mold layers 30 and 34 may have different etching characteristics. The first mold layer 30 may be formed to have a thickness substantially the same as a height of an insulation pattern 14b (refer to FIG. 12) that may be subsequently formed. For example, the first mold layer 30 may be formed to have a thickness that may be about 50% to about 90% of capacitor structures 24a and 24b (refer to FIG. 11) subsequently formed.

A total thickness of the second etch stop layer 32 and the second mold layer 34 may be substantially the same as a thickness of an air gap subsequently formed.

Referring to FIG. 11, an etching mask (not shown) may be formed on the second mold layer 34. The etching mask may include a photoresist pattern or a hard mask.

The second mold layer 34, the second etch stop layer 32 and the first mold layer 30 may be etched using the etching mask. In the etching process, a plurality of holes exposing top surfaces of the substrate 10 in the contact regions may be formed. The holes may have a width becoming narrower from a top portion toward a bottom portion thereof. The holes may have sidewalls slanted with respect to the top surface of the substrate 10.

Processes substantially the same as or similar to those illustrated with reference to FIGS. 5 and 6 may be performed to form lower electrodes 18a and 18b, dielectric layer patterns 20a and 20b and upper electrodes 22a and 22b. Thus, first and second capacitor structures 24a and 24b may be formed in the holes.

By the above process, the first mold layer 30 may be converted into an insulation pattern 14b supporting the first and second capacitor structures 24a and 24b.

Referring to FIG. 12, the second mold layer 34 may be etched to expose the second etch stop layer 32, and the second etch stop layer 32 may be etched. The etching process may include a wet etching process and/or a dry etching process. Due to the second etch stop layer 32, the second mold layer 34 may be selectively etched. Thus, by controlling thicknesses of the second etch stop layer 32 and the second mold layer 34, a thickness of an air gap between the first and second capacitor structures 24a and 24b may be controlled.

By the above process, the insulation pattern 14b may remain between the first and second capacitor structures 24a and 24b.

Thereafter, processes substantially the same as or similar to those illustrated with reference to FIGS. 8 and 9 may be performed to complete the semiconductor device of FIG. 1.

The semiconductor device may include an air gap between the insulation pattern 14b and the plate electrode 28. Thus, a leakage current and a parasitic capacitance may be reduced.

Figure 13:
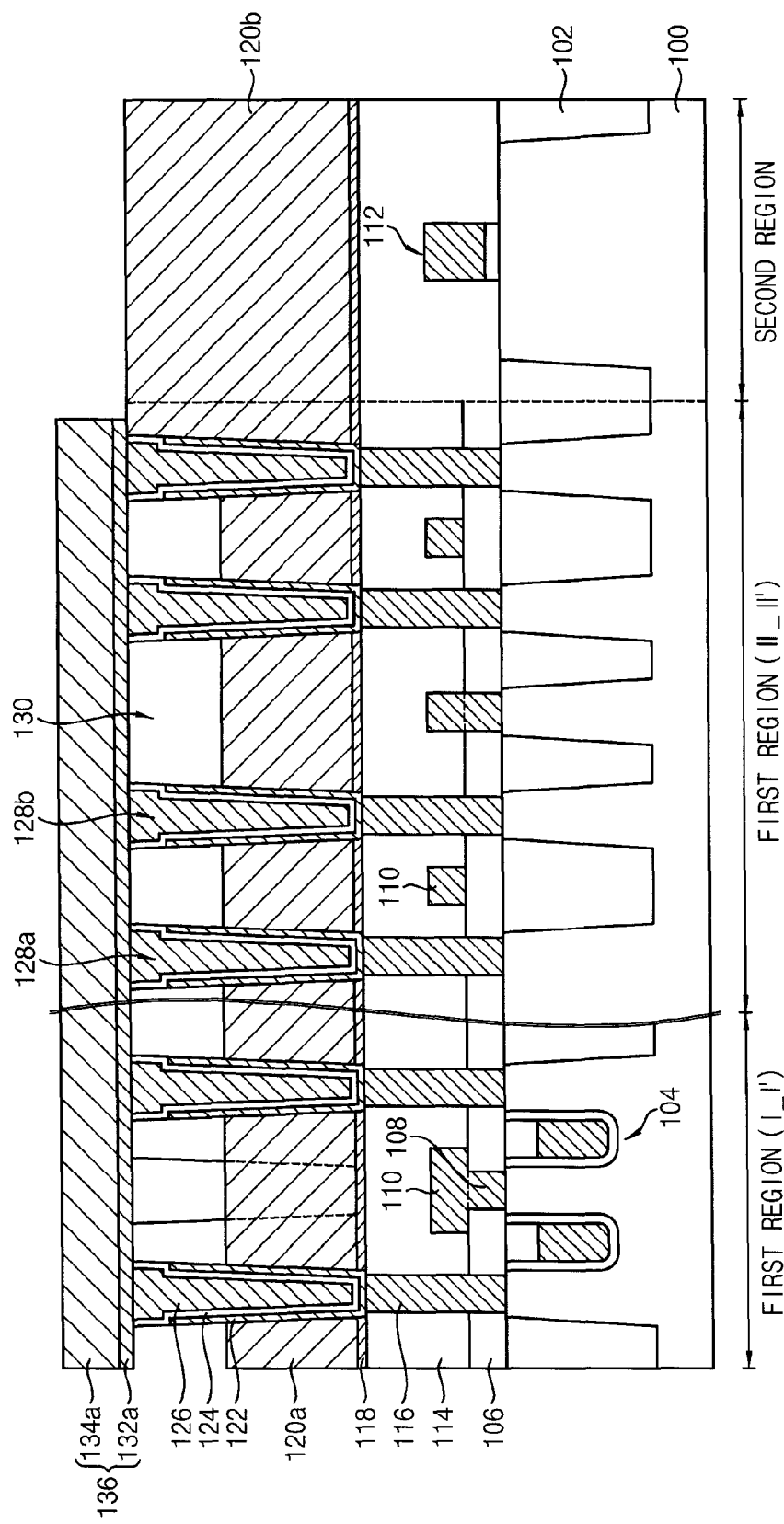
Figure 14:
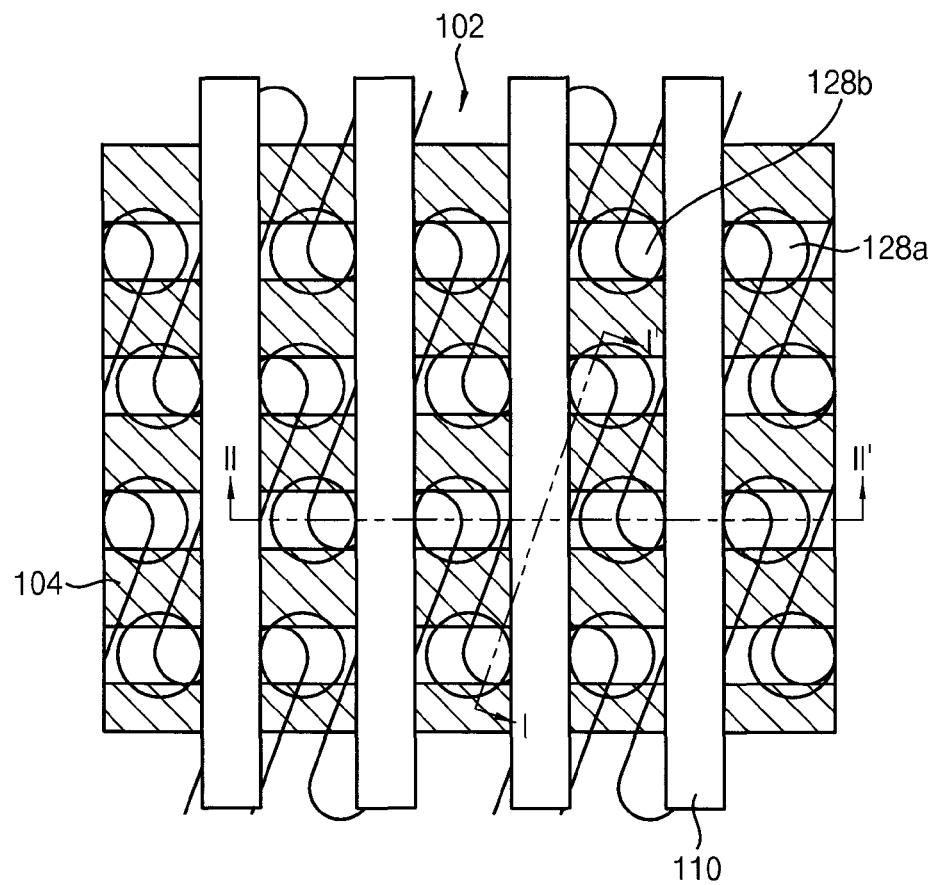
Figure 14:
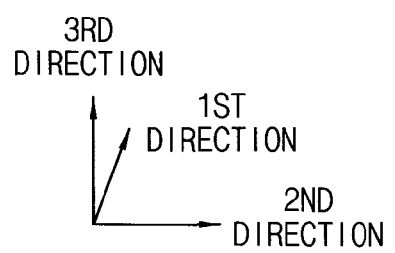

FIG. 13 is a cross-sectional view illustrating a DRAM device in accordance with example embodiments, and FIG. 14 is a plan view of the DRAM device of FIG. 13.

The DRAM device may include the semiconductor device of FIG. 1.

Referring to FIGS. 13 and 14, a substrate 100 including a semiconductor material may be prepared. The substrate 100 may be divided into a first region and a second region. A plurality of memory cells may be formed in the first region, and peripheral circuits may be formed in the second region. The substrate 100 may be divided into an active region and a field region by an isolation layer pattern 102.

Active regions of the substrate 100 in the first region may have an island-like shape and each active region may extend in a first direction. A plurality of first gate structures 104 may be formed in a third direction, and each first gate structure 104 may extend in a second direction substantially perpendicular to the third direction. In example embodiments, the first gate structures 104 may be buried gate structures. Alternatively, the first gate structures 104 may be planar type gate structures.

A first insulating interlayer 106 may be formed on the substrate 100. A plurality of first plugs 108 may be formed through the first insulating interlayer 106 to contact a top surface of the substrate 100.

A bit line 110 may be formed on the first contact plugs 108 and the first insulating interlayer 106. The bit line 110 may extend in the third direction. The bit line 110 may be connected to the first contact plug 108.

A second insulating interlayer 114 may be formed on the bit line 110 and the first insulating interlayer 106. A plurality of second contact plugs 116 may be formed through the first and second insulating interlayers 106 and 114 to contact a top surface of the substrate 100. The second contact plugs 116 may be storage node contact plugs. The second contact plugs 116 may be spaced apart from each other and disposed regularly.

A plurality of capacitors may be formed on the second contact plugs 116.

The capacitors may have a structure substantially the same as that of FIG. 1. That is, the capacitors may include first and second capacitor structures 128a and 128b adjacent to each other, a first insulation pattern 120a partially filling a space between the first and second capacitor structures 128a and 128b, and a plate electrode 136 forming an air gap 130 above the first insulation pattern 120a and connecting the first and second capacitor structures 128a and 128b to the upper electrodes 126.

The first and second capacitor structures 128a and 128b may include a lower electrode 122, a dielectric layer pattern 124 and an upper electrode 126. The lower electrode 122 of the first and second capacitor structures 128a and 128b may contact a top surface of the second contact plug 116. An etch stop layer pattern 118 may be formed between the second insulating interlayer 114 and the first insulation pattern 120a.

The plate electrode 136 may be formed above the substrate 100 in the first region.

The capacitor may include an air gap 130 between the first and second capacitor structures 128a and 128b. Thus a leakage current of the first and second capacitor structures 128a and 128b and a parasitic capacitance between the first and second capacitor structures 128a and 128b may be reduced.

Additionally, a distance between the first and second capacitor structures 128a and 128b may be reduced. Thus, a diameter of upper portions of the first and second capacitor structures 128a and 128b may increase, and a capacitance of the first and second capacitor structures 128a and 128b may increase.

Due to the first insulation pattern 120a between the first and second capacitor structures 128a and 128b, the first and second capacitor structures 128a and 128b may not lean or fall down.

Peripheral circuits including MOS transistors may be formed on the substrate 100 in the second region. The MOS transistor may include a second gate structure 112. The second gate structure 112 may include planar type gate structures.

However, no capacitors, such as the capacitors in the first region, may be formed on the substrate 100 in the second region. Thus, there may be no air gap in the second region. A second insulation pattern 120b having a top surface substantially coplanar with a top surface of the first and second capacitor structures 128a and 128b may be formed on the substrate 100 in the second region. There may be no plate electrode 136 on the second insulation layer pattern 120b in the second region.

A landing pad (not shown) may be further formed between the lower electrode 122 and the second contact plug 116. Using the landing pad, the location of the lower electrode 122 may be controlled.

In a process for forming the first insulating interlayer 106, a thin oxide film (not shown) and a nitride layer (not shown) may be sequentially formed on the substrate 100 and a polysilicon layer (not shown) may be formed on the nitride layer instead of forming the first insulating interlayer 106. The polysilicon layer may serve as a second gate electrode of a MOS transistor for the peripheral circuit in the second region. The first contact plug 108 may be formed through the polysilicon layer, the nitride layer and the thin oxide film to contact the substrate 100. That is, the active region of the substrate 100 connected to the first contact plug may serve as a drain region of a memory cell.

FIGS. 15 to 21 are cross-sectional views illustrating a method of manufacturing the DRAM device of FIGS. 13 and 14. FIGS. 15 to 21 includes cross-sectional views of the DRAM device cut along a line I-I' and a line II-II' in a first region and those of the DRAM device cut along in a second region.

Figure 15:
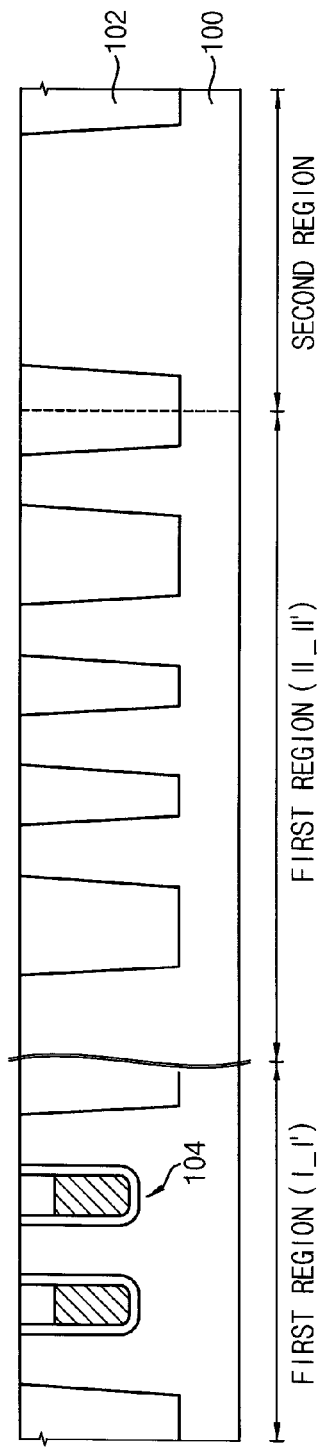

Referring to FIG. 15, an isolation layer pattern 102 may be formed by a shallow trench isolation (STI) process on a substrate 100 that may be divided into the first region and the second region. The substrate 100 may be divided into an active region and a field region by the isolation layer pattern 102.

A plurality of first gate structures 104 may be formed on the substrate 100 in the first region. Each first gate structure 104 may have a linear shape and serve as a word line. In an example embodiment, the first gate structures 104 may include buried gate structures.

Figure 16:
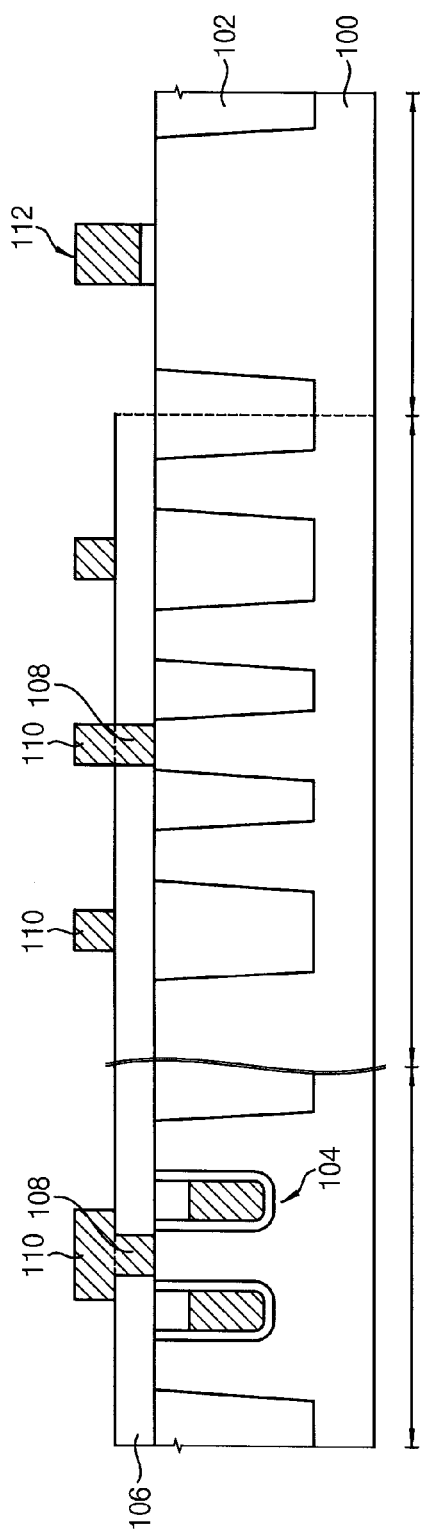

Referring to FIG. 16, a first insulating interlayer 106 may be formed on the substrate 100 in the first region. The first insulating interlayer 106 may be formed to include, e.g., silicon oxide.

The first insulating interlayer 106 may be partially etched to form a plurality contact holes (not shown) exposing top surfaces of the substrate 100. A plurality of first contact plugs 108 filling the first contact holes may be formed using a conductive material.

A bit line 110 may be formed on the first contact plugs 108 and the first insulating interlayer 106.

Second gate structures 112 may be formed on the substrate 100 in the second region. The second gate structures 112 may serve as a gate structure of a MOS transistor in a peripheral circuit region. In example embodiments, a gate electrode included in the second gate structure 112 may be formed in the process for forming the bit line 110.

Figure 17:
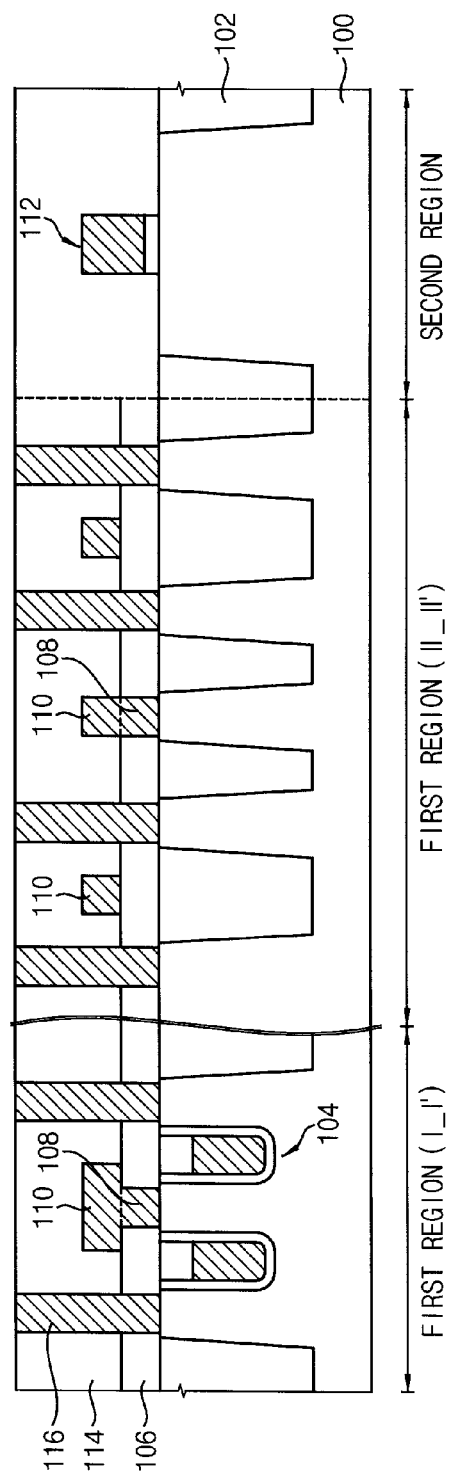

Referring to FIG. 17, a second insulating interlayer 114 may be formed on the first insulating interlayer 106 and the substrate 100. The first and second insulating interlayers 106 and 114 may be partially etched to form a plurality of second contact holes (not shown) exposing top surfaces of the substrate 100. A plurality of second contact plugs 116 may be formed in the second holes using a conductive material. The second contact plugs 116 may serve as storage node contact plugs.

Figure 18:
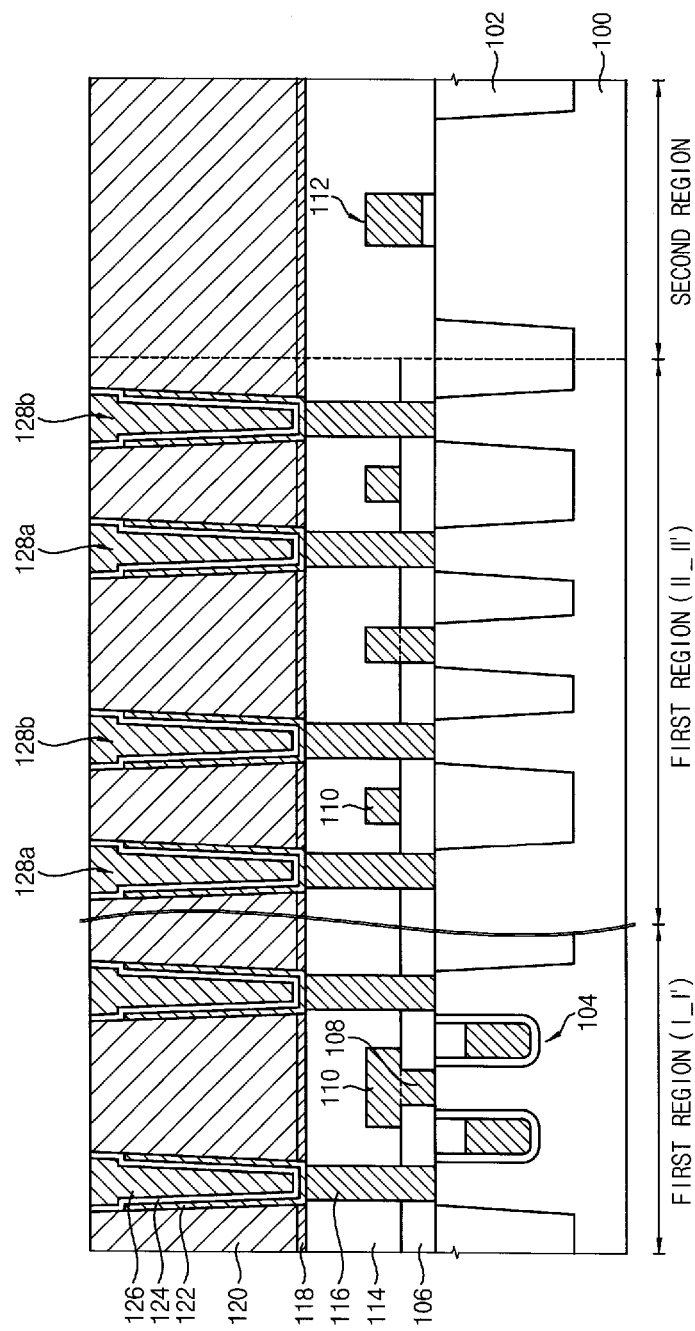

Referring to FIG. 18, first and second capacitor structures 128a and 128b may be formed on the second contact plugs 116. The first and second capacitor structures 128a and 128b may be formed by processes substantially the same as or similar to those illustrated with reference to FIGS. 3 to 6.

The first and second capacitor structures 128a and 128b may be formed on the substrate 100 in the first region. Some of the first and second capacitor structures 128a and 128b may be dummy capacitor structures that may not actually serve as a capacitor of the memory cell.

Figure 19:
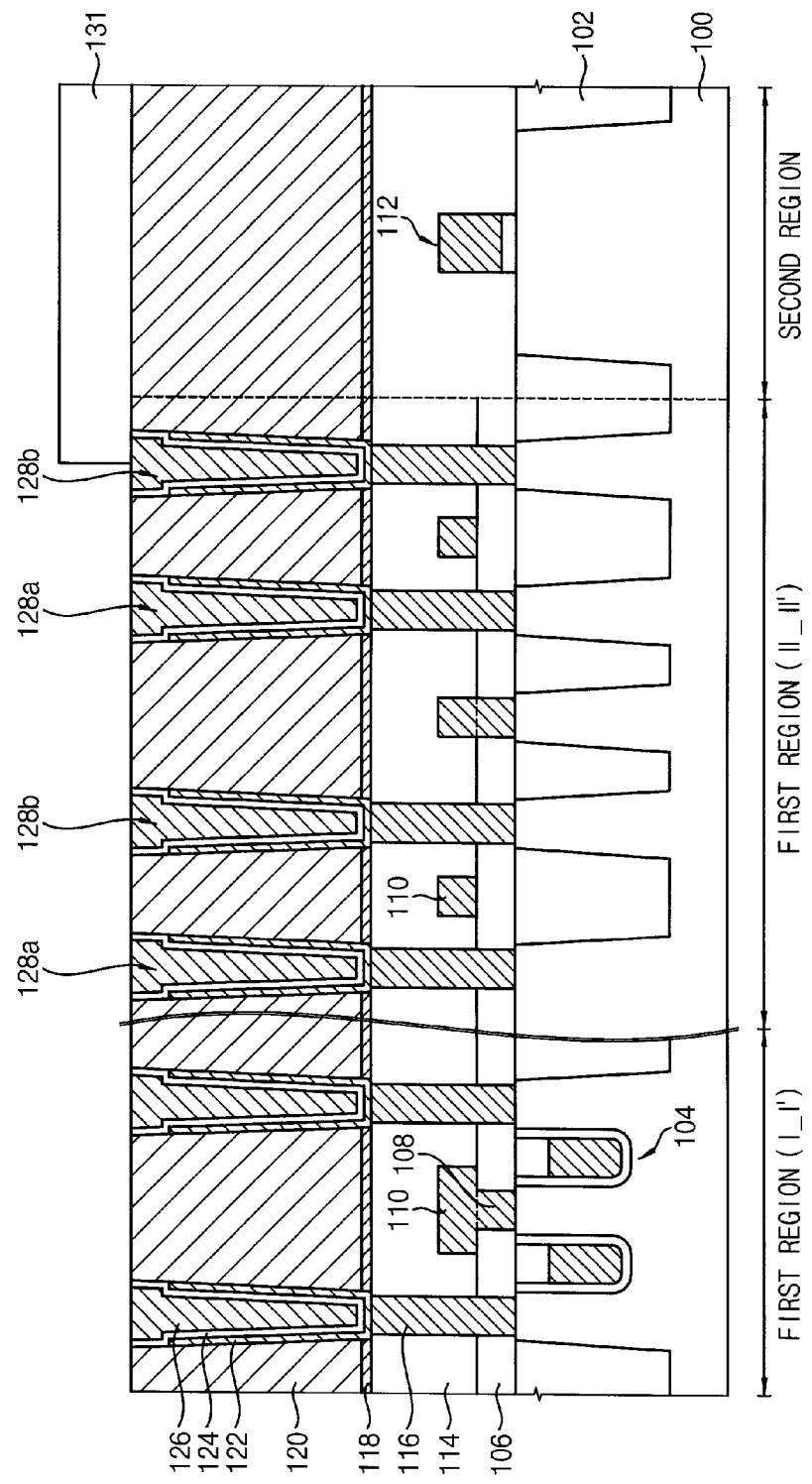

Referring to FIG. 19, a mask 131 may be formed on the first and second capacitor structures 128a and 128b and the mold layer 120. The mask 131 may cover the second region and expose the first region. The mask 131 may include a photoresist pattern.

Figure 20:
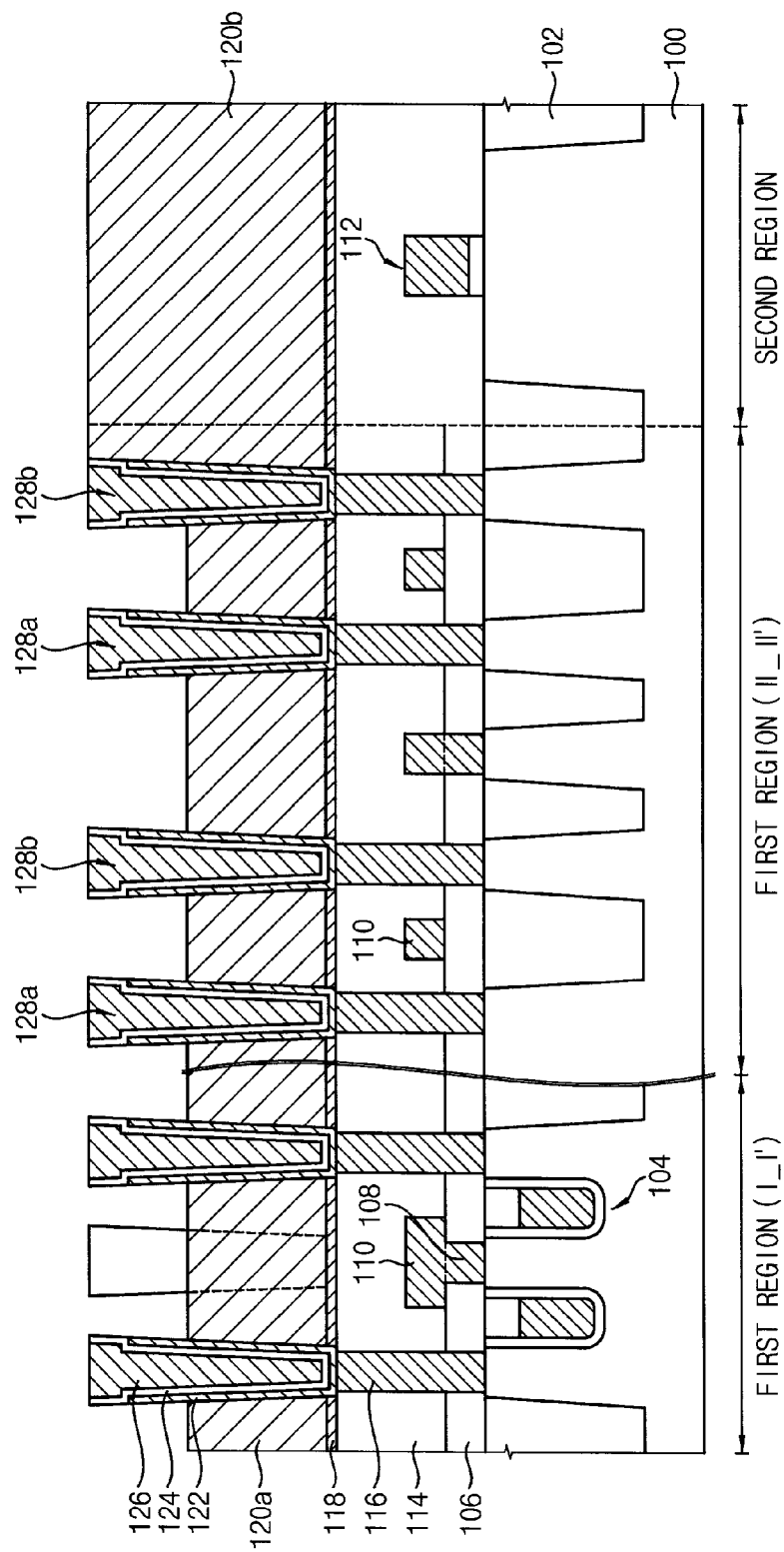

Referring to FIG. 20, a portion of the mold layer 120 in the first region may be partially removed by a dry etch process or a wet etch process.

By the etching process, a first insulation pattern 120a having a thickness less than that of the mold layer 120 may be formed in the first region. The mold layer 120 may remain in the second region, and hereinafter may be referred to as a second insulation pattern 120b of which a top surface may be higher than that of the first insulation pattern 120a. The top surface of the second insulation pattern 120b may be substantially coplanar with that of the first and second capacitor structures 128a and 128b.

The first insulation pattern 120a may be formed between the first and second capacitor structures 128a and 128b to support the first and second capacitor structures 128a and 128b.

Figure 21:
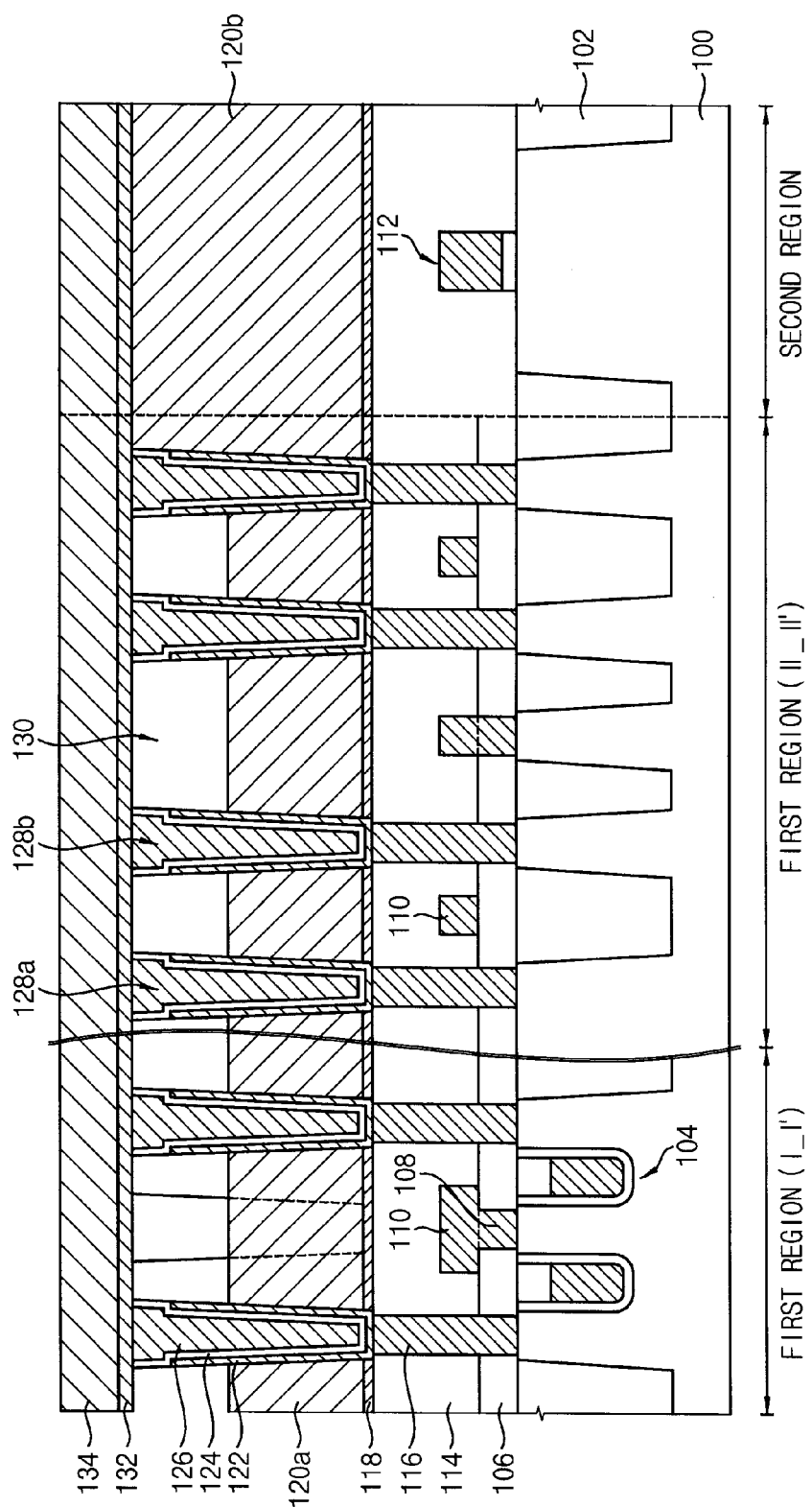

Referring to FIG. 21, a first plate electrode layer 132 may be formed on the upper electrode 126 and the dielectric layer pattern 124 of the first and second capacitor structures 128a and 128b and the second insulation pattern 120b to overlie the first insulation pattern 120a. The first plate electrode layer 132 may be spaced apart from the first insulation pattern 120a to define an air gap 130. That is, the air gap 130 may be formed on the first insulation pattern 120a between the first and second capacitor structures 128a and 128b.

A second plate electrode layer 134 may be formed on the first plate electrode layer 132.

Referring to FIG. 13, the first and second plate electrode layers 132 and 134 may be patterned to form a plate electrode layer 136 in the first region.

By the above processes, the DRAM device of FIGS. 13 and 14 may be manufactured.

Figure 22:
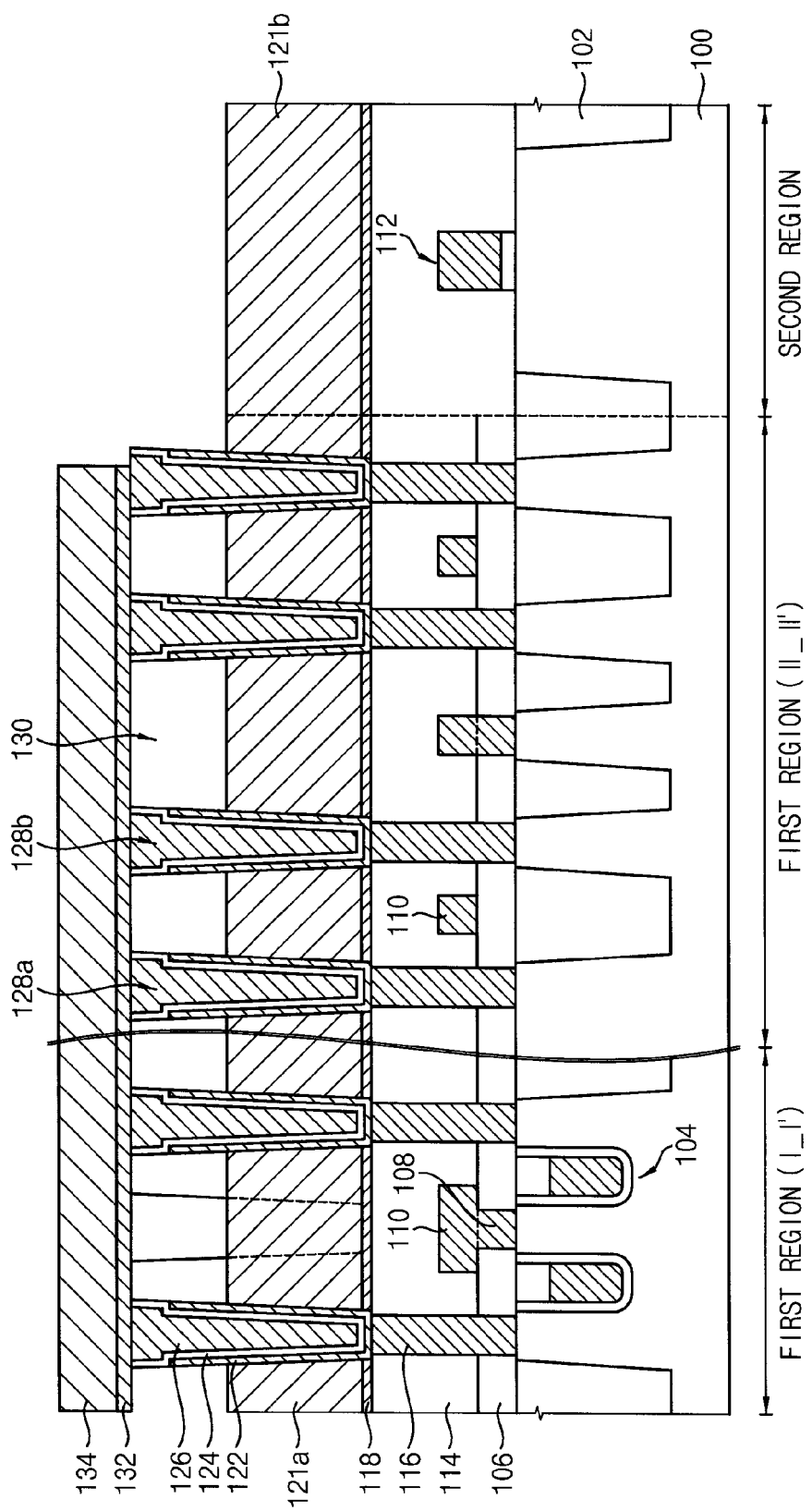

FIG. 22 is a DRAM device in accordance with example embodiments. The DRAM device of FIG. 22 may include substantially the same elements as those of FIG. 13, however, a second insulation pattern 121b in the second region may have a top surface substantially coplanar with that of a first insulation pattern 121a in the first region. Thus, the top surface of the second insulation pattern 121b may be lower than that of the first and second capacitor structures 128a and 128b.

Figure 23:
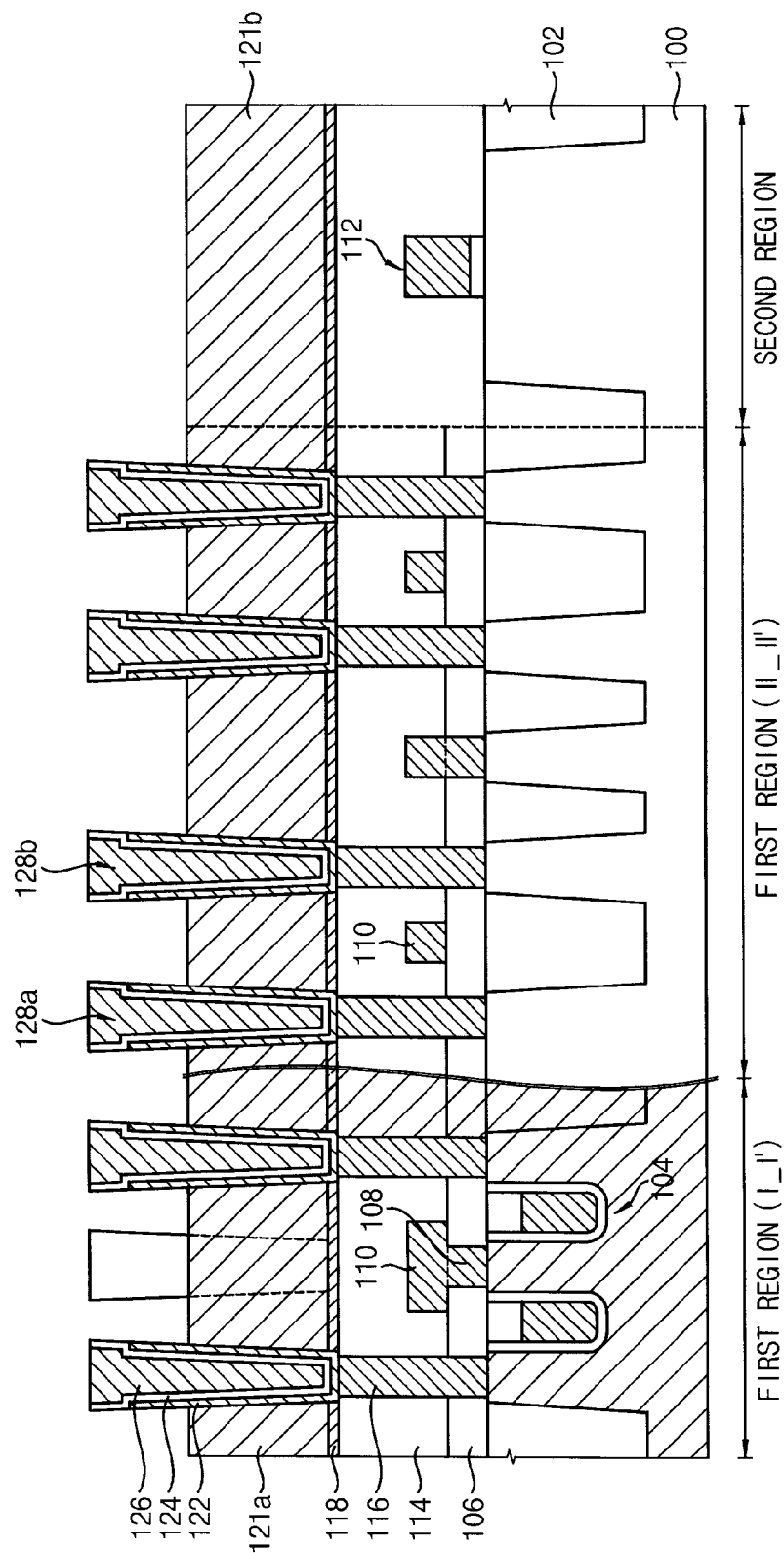
Figure 24:
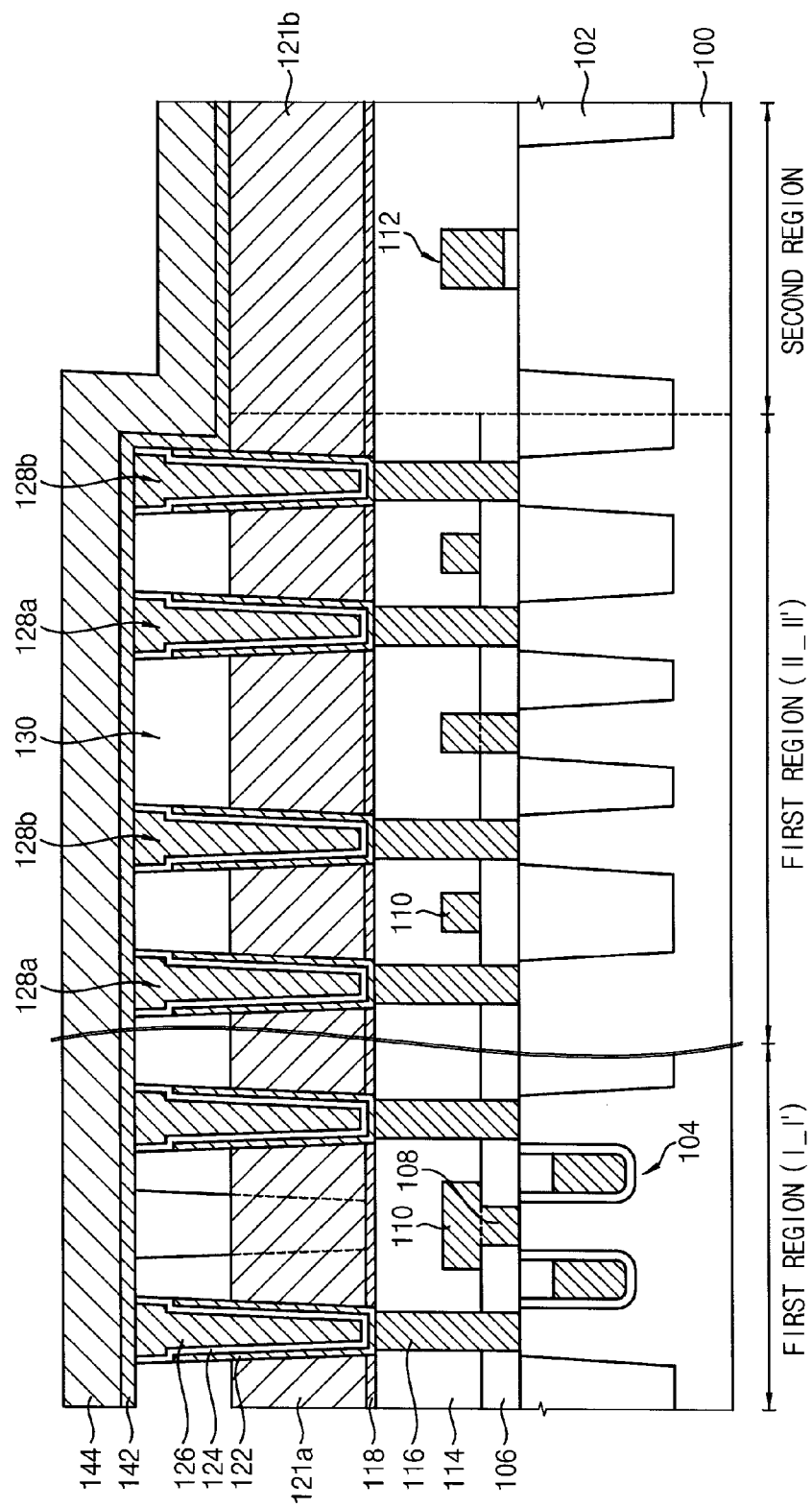

FIGS. 23 and 24 are cross-sectional views illustrating stages of a method of manufacturing the DRAM device of FIG. 22.

First, processes substantially the same as or similar to those illustrated with reference to FIGS. 15 to 18 may be performed. Thus, the first and second capacitor structures 128a and 128b may be formed on the second contact plugs 116.

Referring to FIG. 23, a portion of the mold layer 120 may be removed to form a first insulation pattern 121a in the first region and a second insulation pattern 121b in the second region. In the present embodiment, no etching mask may be formed on the mold layer 120, and thus portions of the mold layer 120 both in the first and second regions may be removed. The etching process may include a dry etch process and/or a wet etch process. When a wet etch process is performed, damage to underlying layers may be reduced or prevented. The first and second insulation patterns 121a and 121b may be formed to have substantially the same thickness.

The first insulation pattern 121a may be formed between the first and second capacitor structures 128a and 128b in the first region to support the first and second capacitor structures 128a and 128b. Additionally, the second insulation pattern 121b may have a top surface lower than those of the first and second capacitor structures 128a and 128b.

Referring to FIG. 24, a first plate electrode layer 142 may be formed on the upper electrode 126 and the dielectric layer pattern 124 of the first and second capacitor structures 128a and 128b and the second insulation pattern 121b to overlie the first insulation pattern 121a. The first plate electrode layer 142 may be spaced apart from the first insulation pattern 121a. Thus, an air gap 130 may be formed between the first plate electrode layer 142 and the first insulation pattern 121a.

A top surface of the first plate electrode layer 142 on the second insulation pattern 121b may be lower than a top surface of the first plate electrode layer 142 on the first and second capacitor structures 128a and 128b. A second plate electrode layer 144 may be formed on the first plate electrode layer 142.

Referring to FIG. 22 again, the first and second plate electrode layers 142 and 144 may be patterned to form a plate electrode 146 in the first region. Thus, the DRAM device of FIG. 22 may be manufactured.

Figure 25:
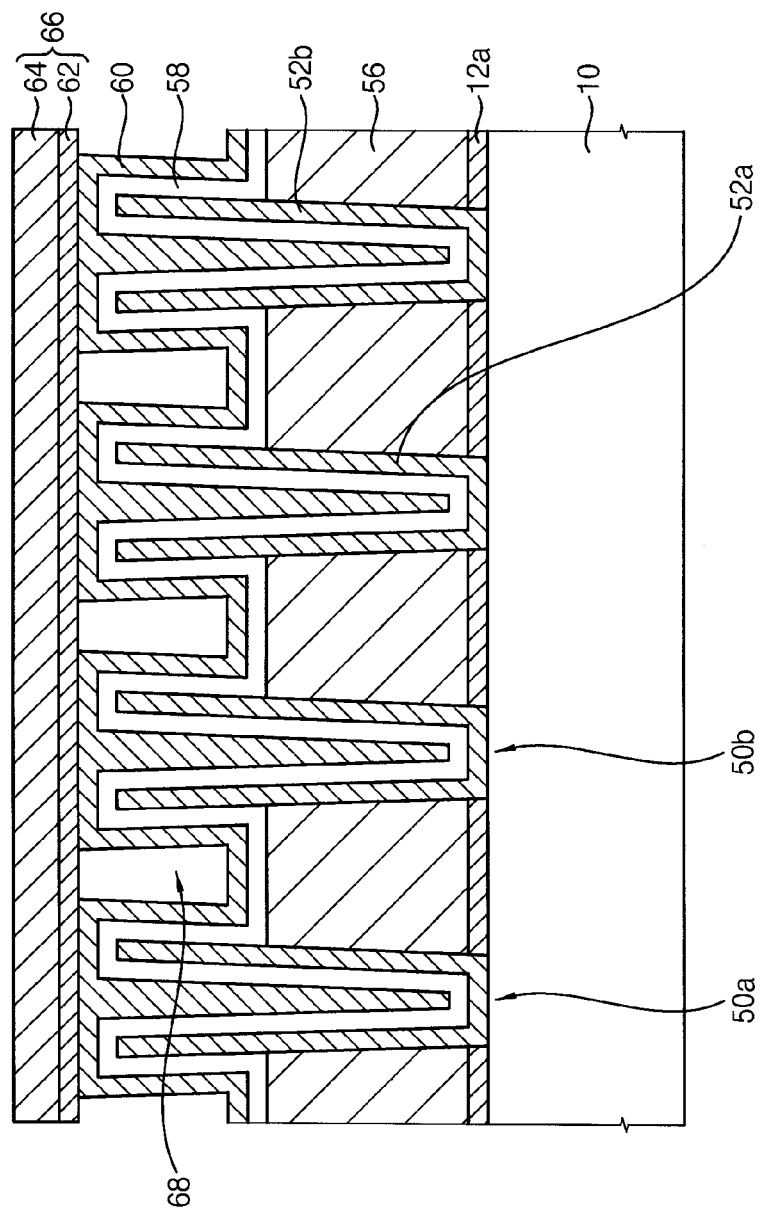

FIG. 25 is a cross-sectional view illustrating a semiconductor device in accordance with example embodiments.

Referring to FIG. 25, the semiconductor device may include first and second capacitor structures 50*a* and 50*b*, an insulation pattern 56, and a plate electrode 66. The first and second capacitor structures 50*a* and 50*b* may be adjacent to each other on a substrate 10, the insulation pattern 56 may partially fill a space between the first and second capacitor structures 50*a* and 50*b*, and the plate electrode 66 may define an air gap 68 over the insulation pattern 56 and be electrically connected to upper electrodes 60 of the first and second capacitor structures 50*a* and 50*b*.

A plurality of contact regions and an insulation region may be defined on the substrate 10.

The first capacitor structure 50*a* may include a first lower electrode 52*a*, a first dielectric layer 58 and a first upper electrode 60. The second capacitor structure 50*b* may include a second lower electrode 52*b*, a second dielectric layer 58 and a second upper electrode 60. The first and second capacitor structures 50*a* and 50*b* may have substantially the same shape and construction.

The first and second lower electrodes 52*a* and 52*b* may be spaced apart from each other, however, the first and second dielectric layers 58 may be integrally formed, and also the first and second upper electrodes 60 may be integrally formed.

Each of the first and second lower electrodes 52*a* and 52*b* may have a cylindrical shape. The first and second lower electrodes 52*a* and 52*b* may be formed in the contact regions.

The insulation pattern 56 may be formed between lower outer sidewalls of the first and second lower electrodes 52*a* and 52*b*. That is, lower portions of the first and second lower electrodes 52*a* and 52*b* may be supported by the insulation pattern 56. The insulation pattern 56 may include, e.g., silicon oxide.

The dielectric layer 58 may be formed on inner walls of the first and second lower electrodes 52*a* and 52*b*, upper outer sidewalls of the first and second lower electrodes 52*a* and 52*b*, and on a top surface of the insulation pattern 56.

The upper electrode 60 may be formed on the dielectric layer 58. The upper electrode 60 may fill inner spaces of the cylindrical first and second lower electrodes 52*a* and 52*b*, however, there may be spaces above the upper electrode 60 between the first and second capacitor structures 50*a* and 50*b*. That is, the upper electrode 60 may have a thickness less than about half of a width of a portion of the insulation pattern 56 between the first and second capacitor structures 50*a* and 50*b*.

Thus, the upper electrode 60 may have a protrusion on the first and second lower electrodes 52*a* and 52*b*.

As illustrated above, the upper electrode 60 may be formed on the outer sidewalls of the first and second lower electrodes 52*a* and 52*b* so as to increase the capacitance of the first and second capacitor structures 50*a* and 50*b*.

The insulation pattern 56 may fill a lower portion of a space between the first and second capacitor structures 50*a* and 50*b*. The insulation pattern 56 may support the first and second capacitor structures 50*a* and 50*b* so as to prevent the first and second capacitor structures 50*a* and 50*b* from leaning or falling down.

If a height of the insulation pattern 56 is lower than half of a height of the first and second capacitor structures 50*a* and 50*b*, the first and second capacitor structures 50*a* and 50*b* may not lean or fall down. If the height of the insulation pattern 56 is higher than 90% of the height of the first and second capacitor structures 50*a* and 50*b*, the air gap 68 between the first and second capacitor structures 50*a* and 50*b* may decrease too much so that a leakage current or a parasitic capacitance between the first and second capacitor structures 50*a* and 50*b* may not be sufficiently reduced. Thus, the height of the insulation pattern 56 may be in a range of about 50% to about 90%, preferably, about 60% to about 80%, of the height of the first and second capacitor structures 50*a* and 50*b*.

An etch stop layer pattern 12*a* may be formed between a top surface of the substrate 10 and the insulation pattern 56 in the insulation region.

The plate electrode 66 may directly contact the protrusion of the upper electrode 60. However, the plate electrode 66 may be spaced apart from the portion of the upper electrode 60 on the insulation pattern 56. Accordingly, the air gap 68 may be formed between the plate electrode 66 and the portion of the upper electrode 60 on the insulation pattern 56. The plate electrode 66 may be electrically insulated from the lower electrodes 52*a* and 52*b*.

In the present embodiment, the air gap 68 having a low dielectric constant may be formed near upper portions of the first and second capacitor structures 50*a* and 50*b*. Thus, the first and second capacitor structures 50*a* and 50*b* may have a reduced parasitic capacitance and leakage current.

The capacitor structures 50*a* and 50*b* may serve as a cell capacitor of a DRAM device.

FIGS. 26 to 29 are cross-sectional views illustrating stages of a method of manufacturing the semiconductor device of FIG. 25.

Figure 26:
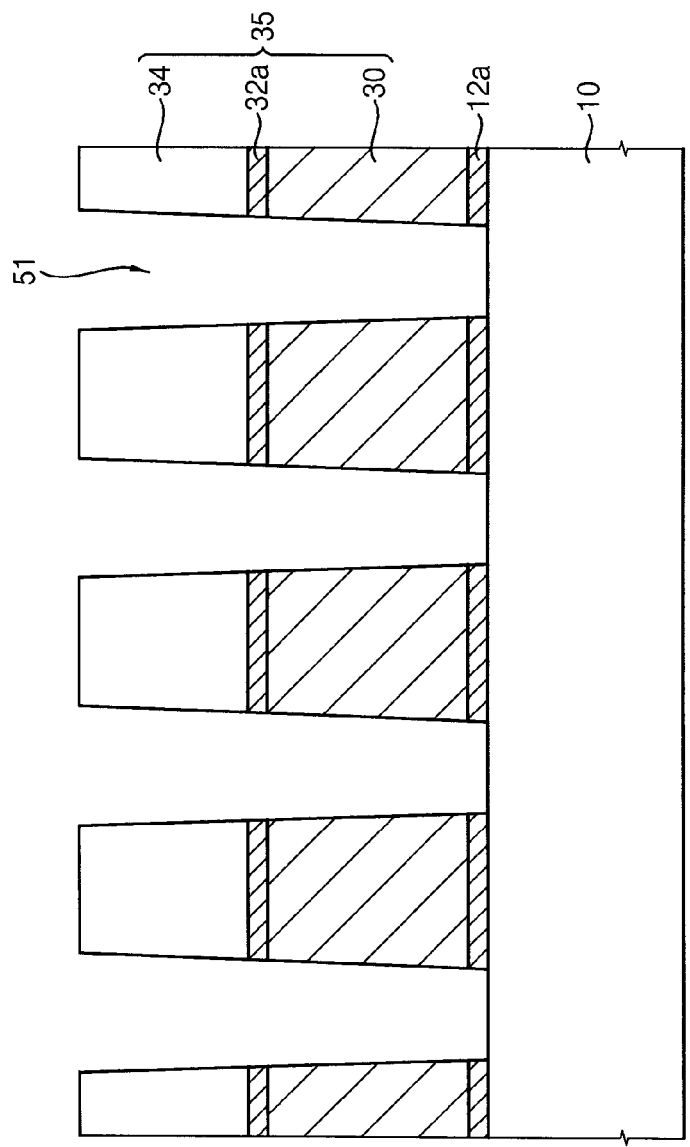

Referring to FIG. 26, a first etch stop layer may be formed on a substrate 10 on which a plurality of contact regions and an insulation region may be defined. A mold layer structure 35 may be formed on the first etch stop layer. The mold layer structure 35 may have a multi-layered structure including a first mold layer 30, a second etch stop layer 32*a* and a second mold layer 34 sequentially stacked. An etching mask (not shown) may be formed on the second mold layer 34.

The second mold layer 34, the second etch stop layer 32*a*, the first mold layer 30 and the first etch stop layer may be etched using the etching mask. By the etching process, a plurality of holes 51 may be formed to expose top surfaces of the substrate 10 in the contact regions. Additionally, the first etch stop layer may be etched to form a first etch stop layer pattern 12*a*. The holes 51 may have a diameter that may become narrower from a top portion toward a bottom portion thereof. The holes 51 may have a sidewall slanted with respect to the top surface of the substrate 10.

Figure 27:
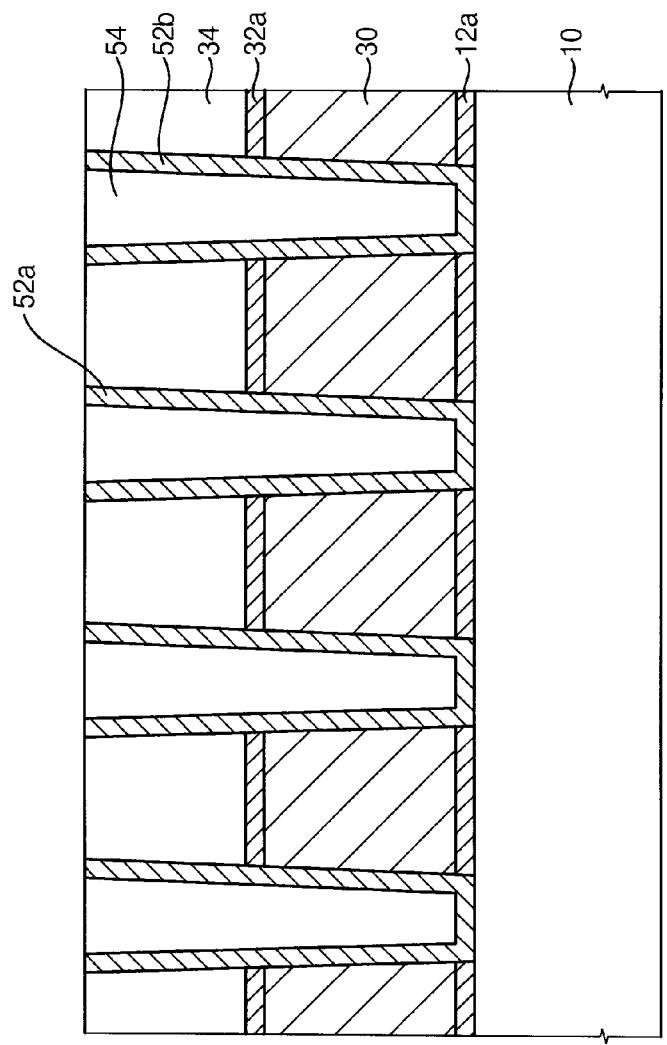

Referring to FIG. 27, a lower electrode layer may be formed on the sidewalls of the holes 51, the exposed top surfaces of the substrate 10, and a top surface of the second mold layer 34. The lower electrode layer may be partially removed to form lower electrodes 52*a* and 52*b* on the sidewalls of the holes 51 and the exposed top surfaces of the substrate 10.

In example embodiments, the cylindrical lower electrodes 52*a* and 52*b* may be formed by forming the lower electrode layer, forming a sacrificial layer to fill an inner space by the lower electrode layer, and planarizing upper portions of the sacrificial layer and the lower electrode layer to expose the top surface of the second mold layer 34.

Figure 28:
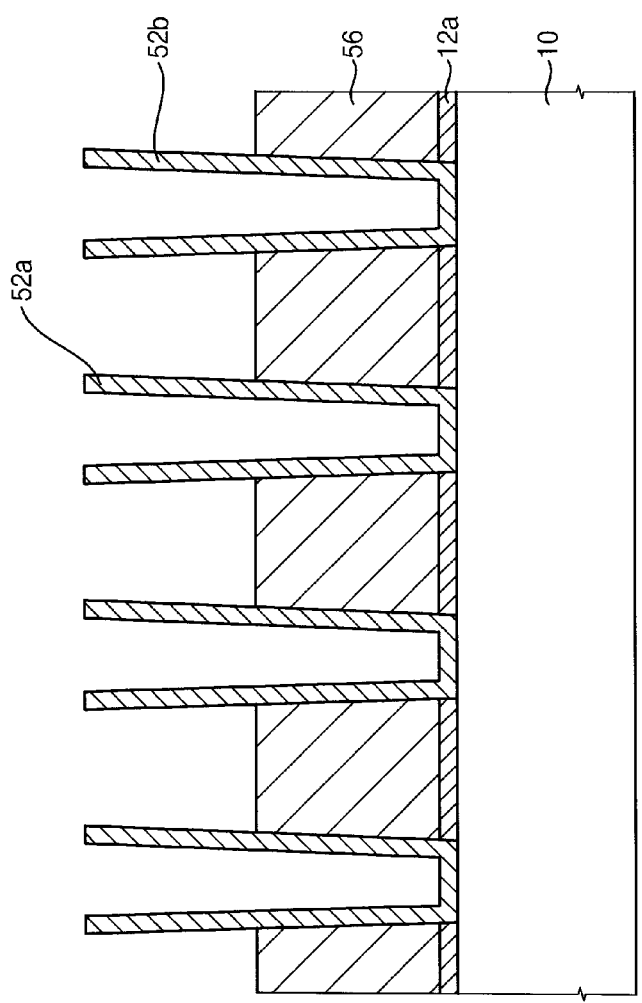

Referring to FIG. 28, the second mold layer 34 and the sacrificial layer 54 may be etched, and further the second etch stop layer 32 may be etched. Thus, an insulation pattern 56 may be formed from the first mold layer 30. The etching process may include a dry etch process or a wet etch process.

The insulation pattern 56 may be formed to have a thickness of about 50% to about 90%, preferably, about 60% to about 80%, of a height of the lower electrodes 52a and 52b.

The insulation pattern 56 may support the lower electrodes 52a and 52b, so that the lower electrodes 52a and 52b may not lean or fall down.

Figure 29:
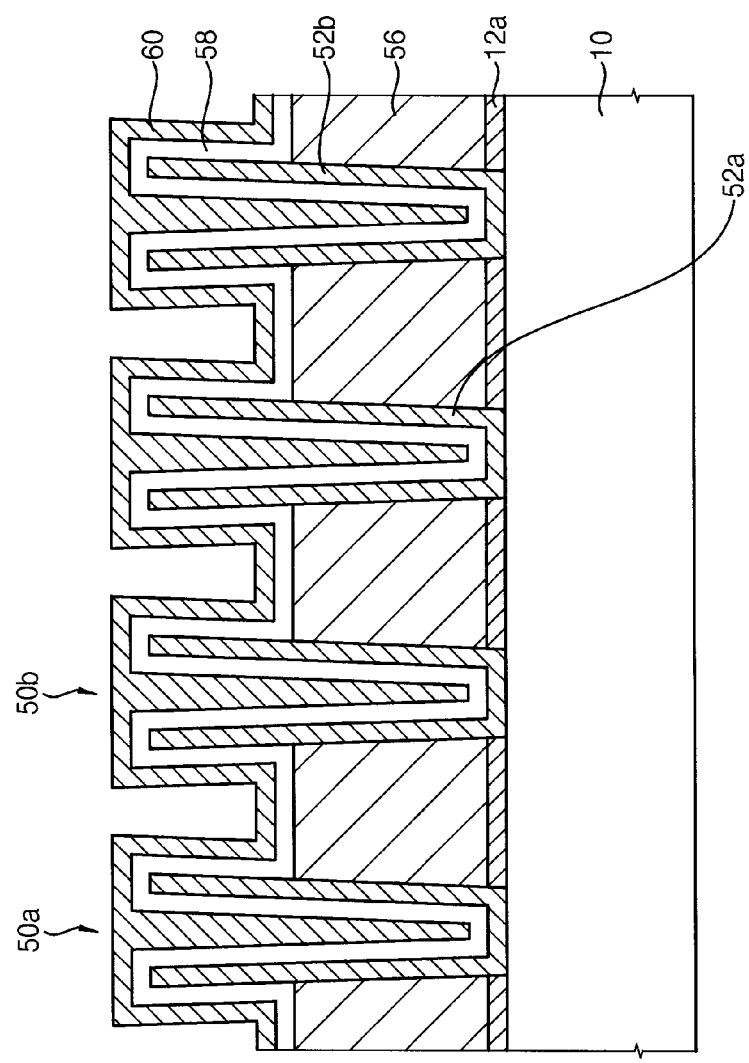

Referring to FIG. 29, a dielectric layer 58 may be formed on the lower electrodes 52a and 52b and the insulation pattern 58. The dielectric layer 58 may not completely fill the inner space by the cylindrical lower electrodes 52a and 52b.

An upper electrode 60 may be formed on the dielectric layer 58. The upper electrode 60 may fill the remaining portion of the inner space by the cylindrical lower electrodes 52a and 52b, however, there may be a space on the insulation pattern 56.

By the above processes, first and second capacitor structures 50a and 50b including the lower electrodes 52a and 52b, the dielectric layer 58 and the upper electrode 60 may be formed in the contact regions.

Referring to FIG. 25 again, a first plate electrode layer 62 may be formed on a portion of the upper electrode 60 to overlie the insulation pattern 56. Thus, an air gap 68 may be formed between a portion of the upper electrode 60 on the insulation pattern 56 and the first plate electrode layer 62. The first plate electrode layer 62 may directly contact the portion of the upper electrode 60 that may protrude from the insulation pattern 56, and may be spaced apart from the portion of the upper electrode 60 on the insulation pattern 56.

The first plate electrode layer 62 may not completely fill a space on the upper electrode 60 on the insulation pattern 56, and thus may be formed under a deposition condition having a poor step coverage.

A second plate electrode layer 64 may be formed on the first plate electrode layer 62 to form a plate electrode 66 electrically connected to the upper electrode 60.

As illustrated above, the semiconductor device may have an air gap 68 between neighboring capacitor structures 50a and 50b, and thus a leakage current of the capacitor structures 50a and 50b may be reduced. Additionally, the capacitor structures 50a and 50b may use the inner wall and a portion of the outer sidewall of the cylindrical lower electrodes 52a and 52b so as to have an increased capacitance.

The method of forming the capacitor structures 50a and 50b may be used for forming a capacitor of a DRAM device.

Figure 30:
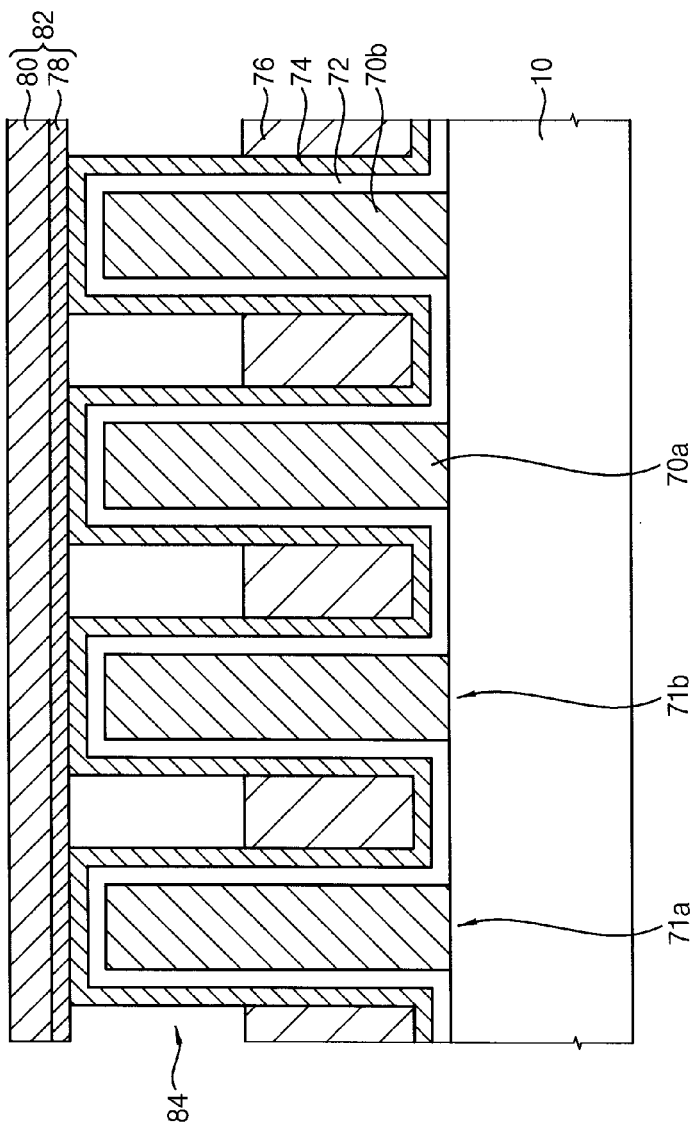

FIG. 30 is a cross-sectional view of a semiconductor device in accordance with example embodiments.

Referring to FIG. 30, the semiconductor device may include first and second capacitor structures 71a and 71b, an insulation pattern 76, and a plate electrode 82. The first and second capacitor structures 71a and 71b may be adjacent to each other, the insulation pattern 76 may partially fill a space between the first and second capacitor structures 71a and 71b, and the plate electrode 82 may define an air gap 84 together with the insulation pattern 76 between the first and second capacitor structures 71a and 71b, and electrically connect upper electrodes of the first and second capacitor structures 71a and 71b.

A plurality of contact regions and an insulation region may be defined on the substrate 100. For example, contact plugs may be formed in the contact regions, and an insulating interlayer may be formed in the insulation region.

The first capacitor structure 71a may include a first lower electrode 70a, a first dielectric layer 72 and a first upper electrode 74. The second capacitor structure 71b may include a second lower electrode 70b, a second dielectric layer 72 and a second upper electrode 74. The first and second capacitor structures 71a and 71b may have substantially the same shape and construction.

The first and second lower electrodes 71a and 71b may be spaced apart from each other, however, the first and second dielectric layers 72 may be integrally formed, and also the first and second upper electrodes 74 may be integrally formed.

Each of the first and second lower electrodes 70a and 70b may have a pillar shape. The first and second lower electrodes 70a and 70b may be formed in the contact regions.

The dielectric layer 72 may be formed on outer sidewalls and top surfaces of the first and second lower electrodes 70a and 70b, and on a top surface of the substrate 100 in the insulation region.

The upper electrode 74 may be formed on the dielectric layer 72, however, there may be spaces above the upper electrode 74 between the first and second lower electrodes 70a and 70b. That is, the upper electrode 74 may have a thickness less than about half of a distance between the first and second lower electrodes 70a and 70b.

Thus, the upper electrode 74 may have a protrusion on the first and second lower electrodes 70a and 70b.

The insulation pattern 76 may fill a lower portion of a space between the first and second capacitor structures 71a and 71b. The insulation pattern 76 may be formed on a portion of the upper electrode 74 between the first and second capacitor structures 71a and 71b so as to prevent the first and second capacitor structures from leaning or falling down.

The plate electrode 82 may directly contact the protrusion of the upper electrode 74. However, the plate electrode 82 may be spaced apart from the portion of the upper electrode 74 on the insulation pattern 76. Accordingly, the air gap 84 may be formed between the plate electrode 82 and the insulation pattern 76. The plate electrode 82 may be electrically insulated from the lower electrodes 70a and 70b.

In the present embodiment, the air gap 84 having a low dielectric constant may be formed near upper portions of the first and second capacitor structures 71a and 71b. Thus, the first and second capacitor structures 71a and 71b may have a reduced parasitic capacitance and leakage current.

The capacitor structures 71a and 71b may serve as a cell capacitor of a DRAM device.

Figure 31:
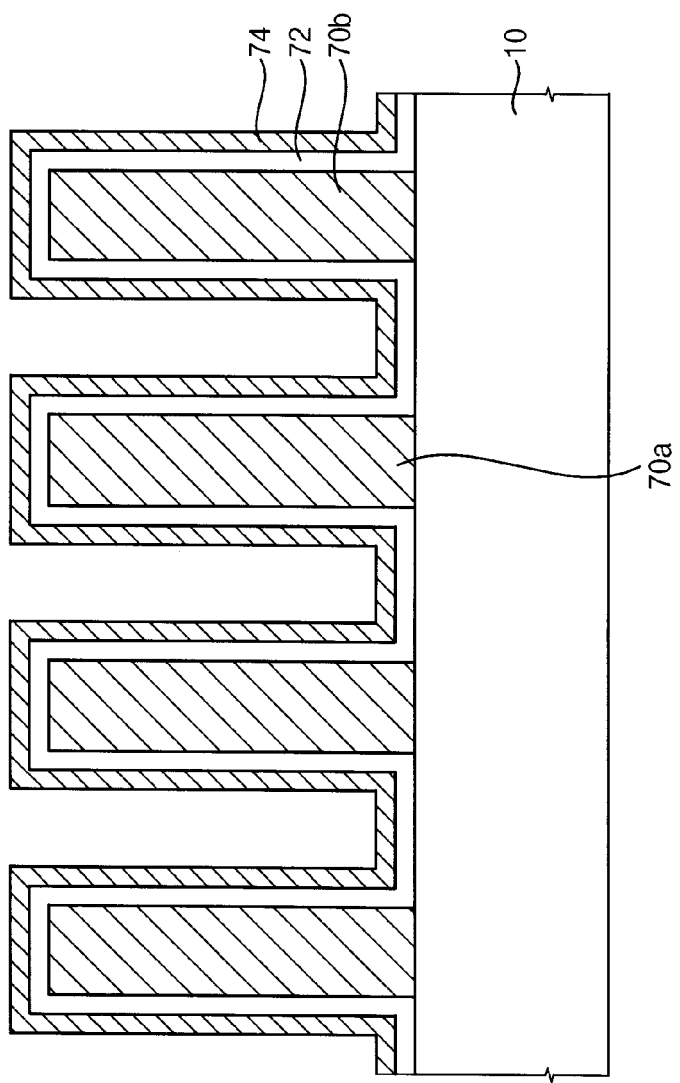
Figure 32:
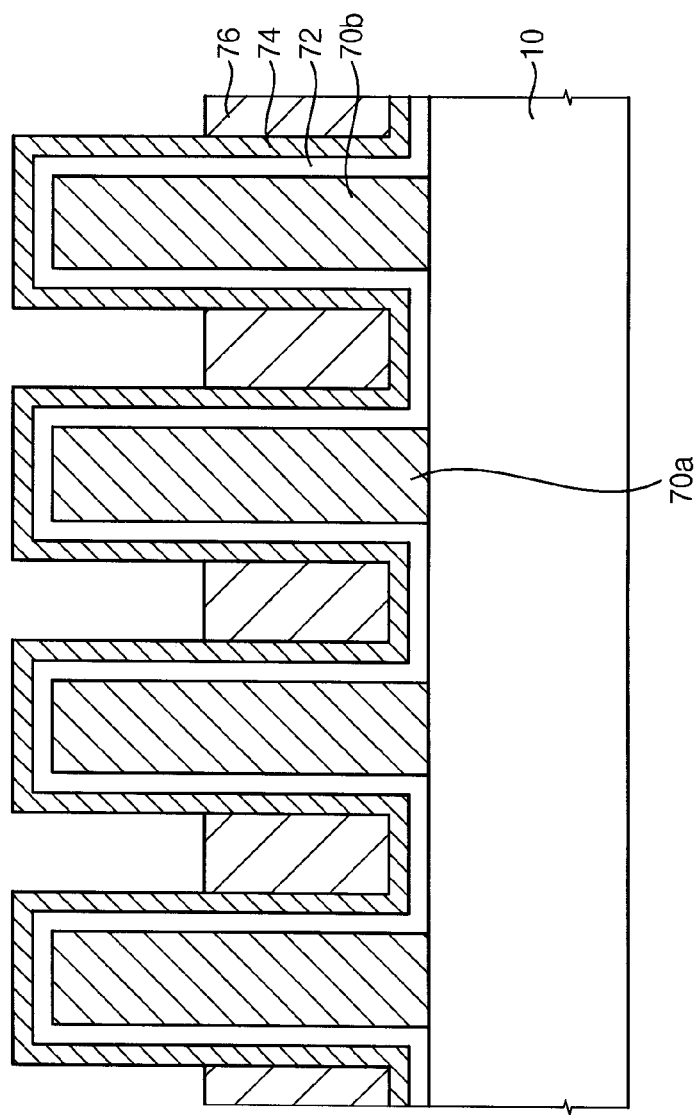

FIGS. 31 and 32 are cross-sectional views illustrating stages of a method of manufacturing the semiconductor device of FIG. 30.

Referring to FIG. 31, lower electrodes 70a and 70b may be formed on the substrate 10 on which a plurality of contact regions and an insulation region may be defined. The lower electrodes 70a and 70b may have a pillar shape.

In example embodiments, a mold layer (not shown) may be formed, the mold layer may be partially etched to form a plurality of holes (not shown) exposing top surfaces of the substrate 10, a conductive layer filling the holes may be formed, and an upper portion of the conductive layer may be planarized to form the lower electrodes 70a and 70b. The mold layer may be removed.

Alternatively, the lower electrodes 70a and 70b may be formed by forming a lower electrode layer on the substrate 10, and patterning the lower electrode layer.

A dielectric layer 72 may be formed on outer sidewalls and top surfaces of the lower electrodes 70a and 70b and the top surfaces of the substrate 10 in the insulation region. An upper electrode layer 74 may be formed on the dielectric layer 72 to form first and second capacitor structures 71a and 71b including the lower electrodes 70a and 70b, the dielectric layer 72, and the upper electrode 74 in the contact regions. There may be some spaces between the first and second capacitor structures 71a and 71b.

Referring to FIG. 32, an insulation pattern 76 may be formed on a portion of the upper electrode 74 between the first and second capacitor structures 71a and 71b. A top surface of the insulation pattern 76 may have a height lower than those of the first and second capacitor structures 71a and 71b. That is, the insulation pattern 76 may support lower portions of the first and second capacitor structures 71a and 71b. The upper electrode 74 may have a protrusion protruding from the insulation pattern 76.

The insulation pattern 76 may be formed by forming a mold layer to fill a space between the first and second capacitor structures 71a and 71b, and partially etching the mold layer.

Referring to FIG. 30 again, a first plate electrode layer 78 may be formed on the protrusion of the upper electrode 74 to define an air gap 84 on the insulation pattern 76 between the first and second capacitor structures 71a and 71b. Thus, the first plate electrode layer 78 may be formed under a deposition condition having a poor step coverage.

A second plate electrode layer 80 may be formed on the first plate electrode layer 78 to form a plate electrode 82 electrically connected to the upper electrode 74.

As illustrated above, the semiconductor device may have an air gap 84 between neighboring first and second capacitor structures 71a and 71b so as to have a reduced leakage current.

The method of forming the capacitor structures 71a and 71b may be used for forming a capacitor of a DRAM device.

Figure 33:
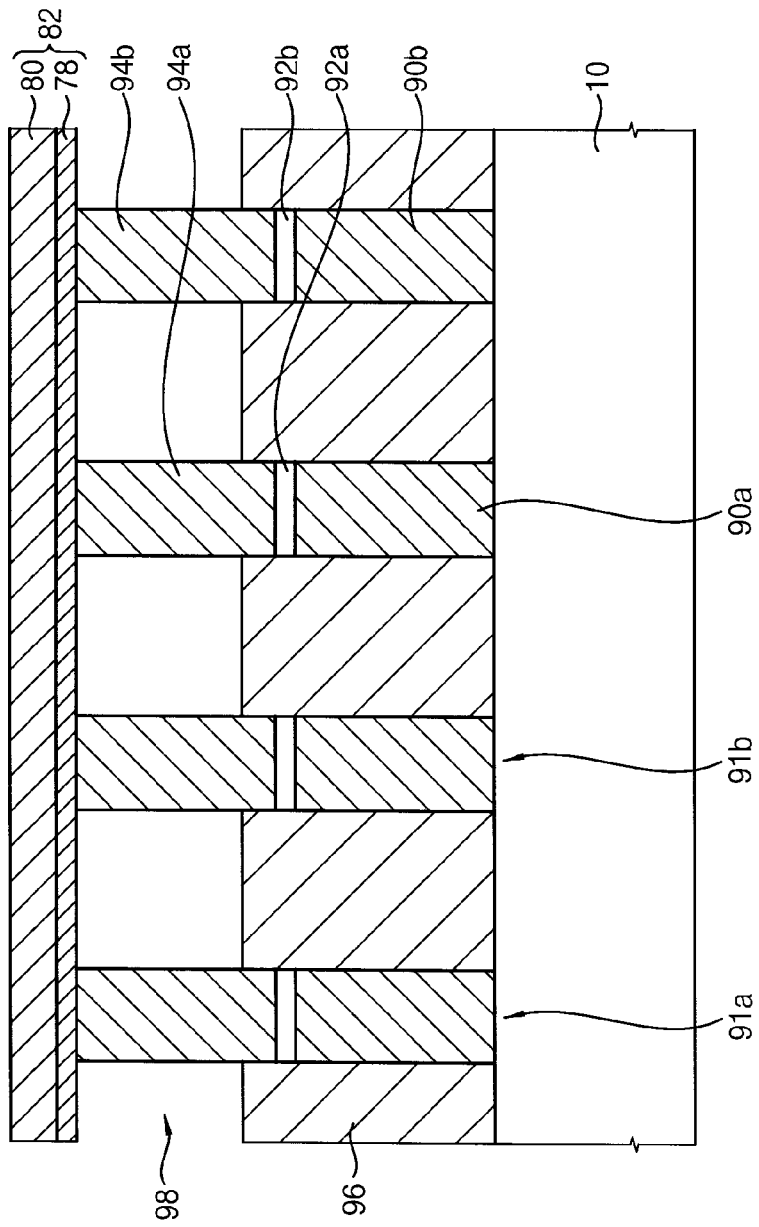

FIG. 33 is a cross-sectional view of a semiconductor device in accordance with example embodiments.

Referring to FIG. 33, the semiconductor device may include first and second capacitor structures 91a and 91b, an insulation pattern 96, and a plate electrode 82. The first and second capacitor structures 91a and 91b may be adjacent to each other, the insulation pattern 96 may partially fill a space between the first and second capacitor structures 91a and 91b, and the plate electrode 82 may define an air gap 98 together with the insulation pattern 96 between the first and second capacitor structures 91a and 91b, and electrically connect upper electrodes 94a and 94b of the first and second capacitor structures 91a and 91b.

A plurality of contact regions and an insulation region may be defined on the substrate 10. For example, contact plugs may be formed in the contact regions, and an insulating interlayer may be formed in the insulation region.

The first capacitor structure 91a may include a first lower electrode 90a, a first dielectric layer pattern 92a and a first upper electrode 94a. The second capacitor structure 91b may include a second lower electrode 90b, a second dielectric layer pattern 92b and a second upper electrode 94b. The first and second capacitor structures 91a and 91b may have substantially the same shape and construction and may be spaced apart from each other.

The first lower electrode 90a, the first dielectric layer pattern 92a and the first upper electrode 94a may be sequentially stacked on the substrate 10 in the contact regions. The second lower electrode 90b, the second dielectric layer pattern 92b and the second upper electrode 94b may be sequentially stacked on the substrate 10 in the contact regions.

The insulation pattern 96 may fill a lower portion of a space between the first and second capacitor structures 91a and 91b. The insulation pattern 96 may be formed on the substrate 10 in the contact regions so as to prevent the first and second capacitor structures 91a and 91b from leaning or falling down. The insulation pattern 96 may have a top surface lower than those of the first and second capacitor structures 91a and 91b.

The plate electrode 82 may directly contact top surfaces of the first and second upper electrodes 94a and 94b. The plate electrode 82 may overlie the insulation pattern 96 and be spaced apart from the insulation pattern 96. Accordingly, the air gap 98 may be formed between the plate electrode 82 and the insulation pattern 96. The plate electrode 82 may be electrically insulated from the lower electrodes 90a and 90b.

In the present embodiment, the air gap 98 having a low dielectric constant may be formed near upper portions of the first and second capacitor structures 91a and 91b. Thus, the first and second capacitor structures 91a and 91b may have a reduced parasitic capacitance and leakage current.

Figure 34:
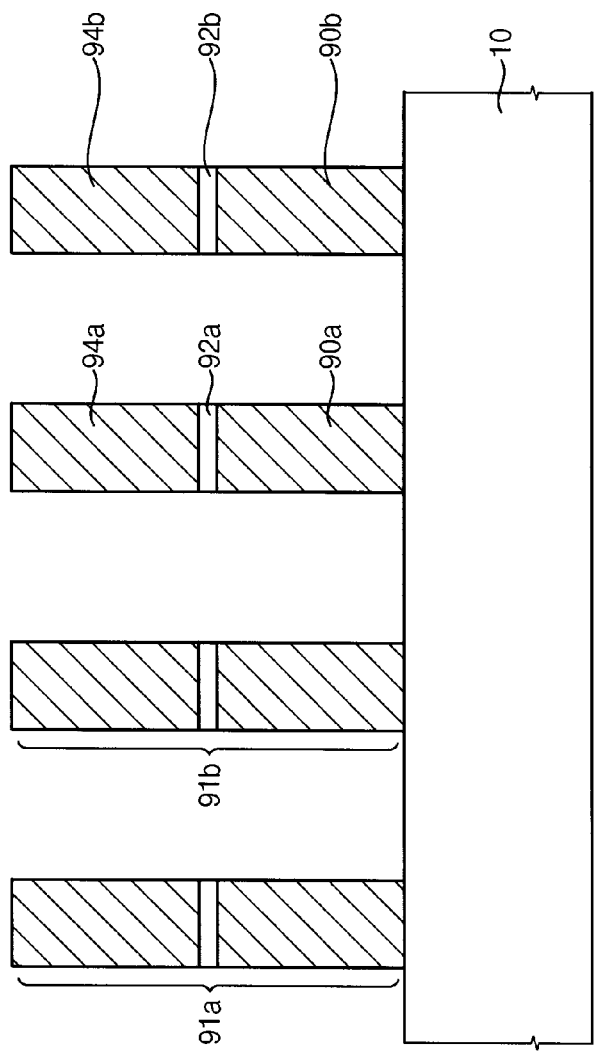
Figure 35:
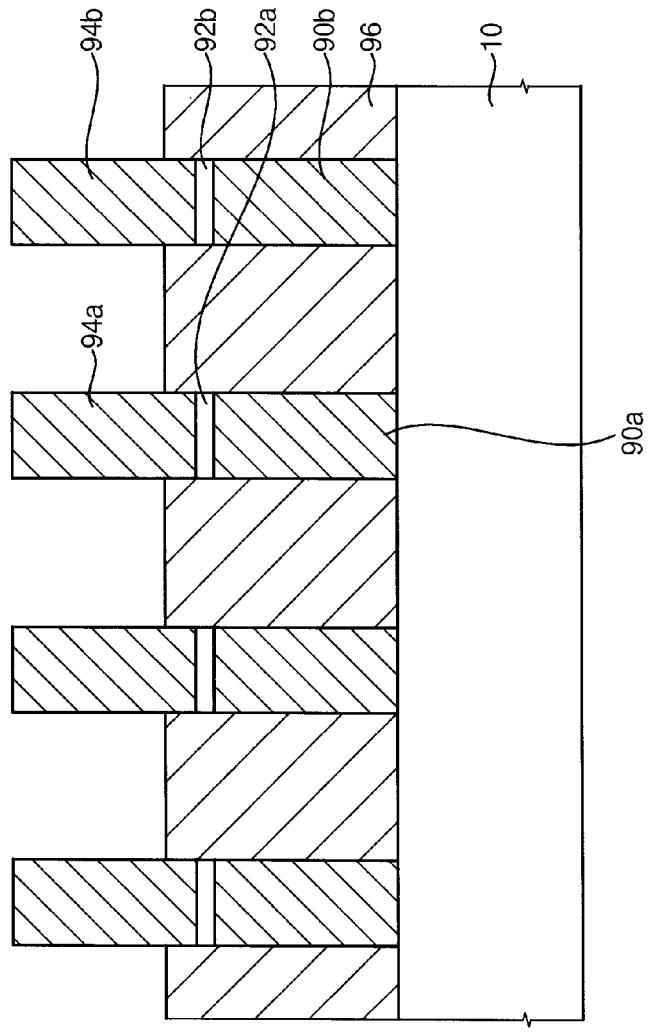

FIGS. 34 and 35 are cross-sectional views illustrating stages of a method of manufacturing the semiconductor device of FIG. 33.

Referring to FIG. 34, a lower electrode layer, a dielectric layer and an upper electrode layer may be sequentially formed on a substrate 10 on which a plurality of contact regions and an insulation region may be defined.

An etching mask (not shown) may be formed on the upper electrode layer, and the upper electrode layer, the dielectric layer and the lower electrode layer may be etched using the etching mask to form a plurality of stacked structures. Hereinafter, neighboring stacked structures may be referred to as first and second capacitor structures 91a and 91b. The first capacitor structure 91a may include a first lower electrode 90a, a first dielectric layer pattern 92a and a first upper electrode 94a sequentially stacked on the substrate 10 in the contact regions, and the second capacitor structure 91b may include a second lower electrode 90b, a second dielectric layer pattern 92b and a second upper electrode 94b sequentially stacked on the substrate 10 in the contact regions.

Referring to FIG. 35, a mold layer may be formed to fill a space between the first and second capacitor structures 91a and 91b, and the mold layer may be partially etched to form an insulation pattern 96. The insulation pattern 96 may have a top surface lower than those of the first and second capacitor structures 91a and 91b.

Referring to FIG. 33 again, a first plate electrode layer 78 may be formed on the upper electrodes 94a and 94b to define an air gap 98 on the insulation pattern 96 between the first and second capacitor structures 91a and 91b. Thus, the first plate electrode layer 78 may be formed under a deposition condition having a poor step coverage.

A second plate electrode layer 80 may be formed on the first plate electrode layer 78 to form a plate electrode 82 electrically connected to the upper electrodes 94a and 94b.

As illustrated above, the semiconductor device may have an air gap 98 between neighboring first and second capacitor structures 91a and 91b so as to have a reduced leakage current.

The method of forming the capacitor structures 91a and 91b may be used for forming a capacitor of a DRAM device.

Figure 36:
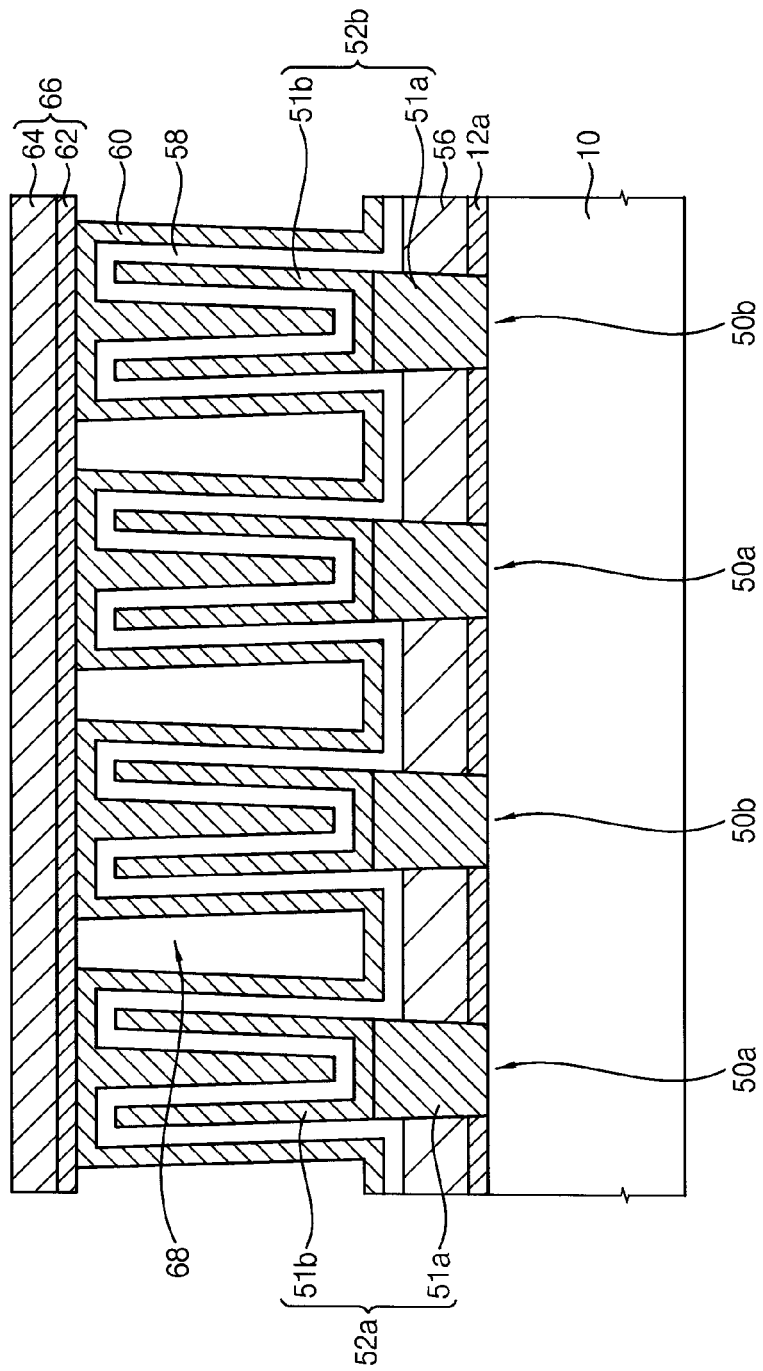

FIG. 36 is a cross-sectional view of a semiconductor device in accordance with example embodiments.

Referring to FIG. 36, the semiconductor device may include first and second capacitor structures 50a and 50b, an insulation pattern 56, and a plate electrode 66. The first and second capacitor structures 50a and 50b may be adjacent to each other, the insulation pattern 56 may partially fill a space between the first and second capacitor structures 50a and 50b, and the plate electrode 66 may define an air gap 68 together with the insulation pattern 56 between the first and second capacitor structures 50*a* and 50*b*, and be electrically connected to an upper electrode 60 of the first and second capacitor structures 50*a* and 50*b*.

The first capacitor structure 50*a* may include a first lower electrode 52*a*, a first dielectric layer 58 and a first upper electrode 60. The second capacitor structure 50*b* may include a second lower electrode 52*b*, a second dielectric layer 58 and a second upper electrode 60. The first and second capacitor structures 50*a* and 50*b* may have substantially the same shape and construction.

The first and second lower electrodes 52*a* and 52*b* may be spaced apart from each other, however, the first and second dielectric layers 58 may be integrally formed, and also the first and second upper electrodes 60 may be integrally formed.

Each of the first and second lower electrodes 52*a* and 52*b* may include a lower portion 51*a* and an upper portion 51*b* having different shapes from each other. That is, the lower portion 51*a* may have a pillar shape, and the upper portion 51*b* may have a cylindrical shape. A bottom surface of the cylindrical upper portion 51*b* may contact a top surface of the pillar shaped lower portion 51*a*.

The insulation pattern 56 may be formed between outer sidewalls of the lower portion of the lower electrodes 52*a* and 52*b*. A top surface of the insulation pattern 56 may be lower than the top surface of the lower portion 51*a* of the lower electrodes 52*a* and 52*b*. The insulation pattern 56 may be formed near the lower portion 51*a* of the lower electrodes 52*a* and 52*b* to support the lower electrodes 52*a* and 52*b*. The insulation pattern 56 may not be formed on the upper portion 51*b* of the lower electrodes 52*a* and 52*b*. The insulation pattern 56 may include, e.g., silicon oxide.

The dielectric layer 58 may be formed on inner and outer walls of the upper portion 51*b* of the lower electrodes 52*a* and 52*b*, an upper portion of the outer sidewall of the lower portion 51*a* of the lower electrodes 52*a* and 52*b*, and a top surface of the insulation pattern 56.

The upper electrode 60 may be formed on the dielectric layer 58. In example embodiments, the upper electrode 60 may fill an inner space by the cylindrical upper portion 51*b* of the lower electrodes 52*a* and 52*b*. Alternatively, the upper electrode 60 may partially fill the inner space by the cylindrical upper portion 51*b* of the lower electrodes 52*a* and 52*b*.

The upper electrode 60 may be conformally formed on the dielectric layer 58 so that a space may be formed on the insulation pattern 56 between the first and second capacitor structures 50*a* and 50*b*. That is, the upper electrode 60 may have a thickness less than about half of a width of the insulation pattern 56 between the first and second capacitor structures 50*a* and 50*b*.

An etch stop layer pattern 12*a* may be formed under the insulation pattern 56.

The plate electrode 66 may directly contact a protrusion of the upper electrode 60 on the lower electrodes 52*a* and 52*b*. The plate electrode 66 may overlie the insulation pattern 56 and be spaced apart from a portion of the upper electrode 60 on the insulation pattern 56. Accordingly, the air gap 68 may be formed between the plate electrode 66 and the portion of the upper electrode 60 on the insulation pattern 56. The plate electrode 66 may include a first plate electrode layer 66*a* and a second plate electrode layer 66*b* sequentially stacked.

In the present embodiment, the air gap 68 having a low dielectric constant may be formed between the first and second capacitor structures 50*a* and 50*b*. Thus, the first and second capacitor structures 50*a* and 50*b* may have a reduced parasitic capacitance and leakage current.

The capacitor structures 50*a* and 50*b* may serve as a capacitor of a DRAM device.

The semiconductor device may be applied to various types of systems, e.g., computing systems.

Figure 37:
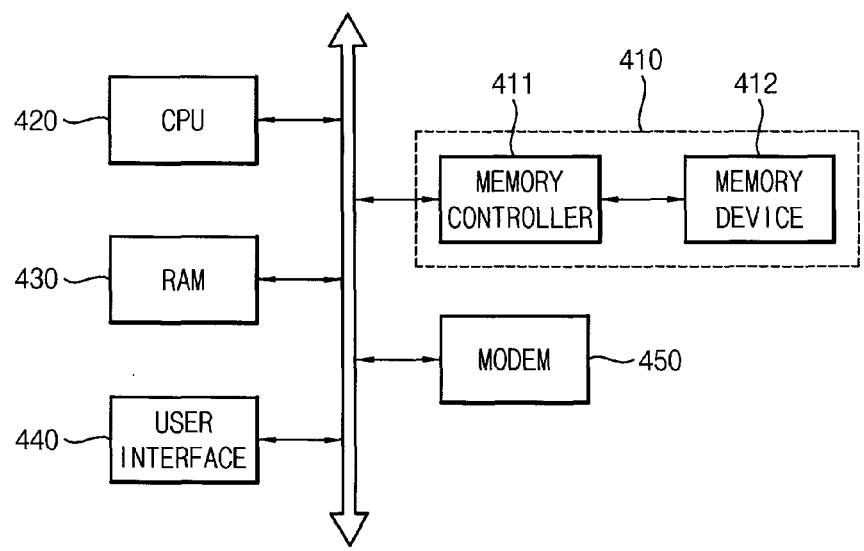

FIG. 37 is a block diagram illustrating a schematic construction of a system in accordance with example embodiments.

Referring to FIG. 37, a system 400 may include a microprocessor (CPU) 420, a RAM 430, a user interface 440, a modem 450 such as a baseband chipset, and a memory system 410. The memory system 410 may include a memory device 412 and a memory controller 411. The memory device 412 may include the semiconductor device or a DRAM device in accordance with example embodiments. The memory controller 411 may control the memory device 412. The memory system 410 including the memory device 412 and the memory controller 411 may serve as a memory card or a solid state disk (SSD). When the system 400 is a mobile device, a battery (not shown) may be further provided to apply an operation voltage to the computing system 400. The system 400 may further include an application chipset, a CMOS image sensor (CIS), etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, comprising:

forming a mold layer on a substrate, the mold layer having first and second holes;

forming a first capacitor structure in the first holes, the first capacitor structure including a first lower electrode, a first dielectric layer and a first upper electrode;

forming a second capacitor structure in the second holes, the second capacitor structure including a second lower electrode, a second dielectric layer and a second upper electrode;

partially etching the mold layer between the first and second capacitor structures to form an insulation pattern; and forming a plate electrode on the first and second upper electrodes to overlie the insulation pattern, an air gap being formed by the plate electrode between the first and second capacitor structures.

2. The method of claim 1, wherein forming the first and second capacitor structures includes:

forming a lower electrode layer on inner walls of the first and second holes and the mold layer;

partially etching the lower electrode layer to form the first and second lower electrodes having a cylindrical shape;

forming a dielectric layer on the first and second lower electrodes and the mold layer;

forming an upper electrode on the dielectric layer to fill remaining portions of the first and second holes; and planarizing upper portions of the upper electrode layer and the dielectric layer to form the first upper electrode and the first dielectric layer in the first holes and to form the second upper electrode and the second dielectric layer in the second holes.

3. The method of claim 1, wherein partially etching the mold layer includes a dry etch process or a wet etch process.

4. The method of claim 1, prior to partially etching the mold layer, further comprising forming a mask covering a portion of the mold layer in which any of the first and second capacitor structures is formed.

5. The method of claim 1, wherein the insulation pattern is formed to have a thickness of about 60% to about 80% of a height of the first and second capacitor structures.

6. The method of claim 1, wherein an inner diameter of each of the first and second holes is greater than a distance between the first and second holes.

7. The method of claim 1, wherein forming the mold layer includes:

forming a mold layer using an insulating material having a dielectric constant lower than silicon nitride; and partially etching the mold layer to form the first and second holes.

8. The method of claim 7, wherein the mold layer includes a first silicon oxide layer, an etch stop layer and a second silicon oxide layer, and the first silicon oxide layer is formed to have a top surface substantially coplanar with a top surface of the insulation pattern.

9. The method of claim 1, wherein forming the plate electrode includes:

forming a first plate electrode layer on the first and second upper electrodes under a deposition condition in which the first plate electrode only partially fills a space between the first and second upper electrodes; and forming a second plate electrode layer on the first plate electrode layer under a second deposition condition having a step coverage better than the first deposition condition.

10. The method of claim 9, wherein the first and second plate electrode layers are formed using substantially the same material.

* * * * *